United States Patent
Ao et al.

(10) Patent No.: US 7,582,489 B2
(45) Date of Patent: Sep. 1, 2009

(54) METHOD FOR MANUFACTURING MAGNETIC SENSOR APPARATUS

(75) Inventors: Kenichi Ao, Tokai (JP); Yasutoshi Suzuki, Okazaki (JP); Hideya Yamadera, Nagoya (JP); Norikazu Ohta, Aichi-gun (JP); Hirofumi Funahashi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/068,988

(22) Filed: Feb. 14, 2008

(65) Prior Publication Data

US 2008/0145956 A1 Jun. 19, 2008

Related U.S. Application Data

(62) Division of application No. 10/717,902, filed on Nov. 21, 2003, now Pat. No. 7,417,269.

(30) Foreign Application Priority Data

| Nov. 21, 2002 | (JP) | ............................. 2002-337416 |
| Nov. 21, 2002 | (JP) | ............................. 2002-337417 |
| Mar. 5, 2003 | (JP) | ............................. 2003-058899 |
| Mar. 5, 2003 | (JP) | ............................. 2003-058900 |
| Mar. 18, 2003 | (JP) | ............................. 2003-073900 |

(51) Int. Cl.
*H01L 21/00* (2006.01)
*G01B 7/30* (2006.01)

(52) U.S. Cl. ............... 438/3; 257/E21.001; 324/207.25

(58) Field of Classification Search ................ 438/3, 438/73, 692; 324/207.25, 207.13; 257/E21.001

See application file for complete search history.

(56) References Cited

U.S. PATENT DOCUMENTS

| 4,276,555 | A | 6/1981 | Vinal |
| 5,471,084 | A | 11/1995 | Suzuki et al. |
| 5,637,995 | A | 6/1997 | Izawa et al. |
| 5,781,005 | A | 7/1998 | Vig et al. |
| 5,825,176 | A | 10/1998 | Babin et al. |
| 5,841,276 | A | 11/1998 | Makino et al. |
| 5,889,403 | A | 3/1999 | Kawase |
| 6,232,767 | B1 | 5/2001 | Kawase et al. |
| 6,246,226 | B1 | 6/2001 | Kawase et al. |

(Continued)

FOREIGN PATENT DOCUMENTS

JP     A-60-064484     4/1985

(Continued)

OTHER PUBLICATIONS

Notice of Preliminary Rejection issued from Korean Patent Office issued on Oct. 31, 2005 for the corresponding Korean patent application No. 2003-0082788 (a copy and English translation thereof).

(Continued)

*Primary Examiner*—Walter L Lindsay, Jr.
(74) *Attorney, Agent, or Firm*—Posz Law Group, PLC

(57) ABSTRACT

A magnetic sensor apparatus includes a semiconductor substrate and a magnetic impedance device for detecting a magnetic field. The magnetic impedance device is disposed on the substrate. The magnetic sensor apparatus has minimum size and is made with low manufacturing cost. Here, the magnetic impedance device detects a magnetic field in such a manner that impedance of the device is changed in accordance with the magnetic filed when an alternating current is applied to the device and the impedance is measured by an external electric circuit.

2 Claims, 22 Drawing Sheets

U.S. PATENT DOCUMENTS

| | | | |
|---|---|---|---|
| 6,472,868 | B1 | 10/2002 | Takayama et al. |
| 6,650,112 | B2 | 11/2003 | Takayama et al. |
| 6,692,153 | B2 | 2/2004 | Ohtsuki et al. |
| 6,732,583 | B1 | 5/2004 | Yasuda et al. |
| 6,734,671 | B2 * | 5/2004 | Murata et al. ............... 257/421 |
| 6,939,050 | B2 | 9/2005 | Ohtsuki et al. |
| 7,218,098 | B2 | 5/2007 | McCarrick et al. |
| 2005/0259902 | A1 | 11/2005 | Ohtsuki et al. |
| 2006/0164204 | A1 | 7/2006 | Nishiwaki et al. |

FOREIGN PATENT DOCUMENTS

| | | |
|---|---|---|
| JP | A-64-021977 | 1/1989 |
| JP | A-02-195284 | 8/1990 |
| JP | U-02-129813 | 10/1990 |
| JP | A-H04-254910 | 9/1992 |
| JP | A-05-288571 | 11/1993 |
| JP | A-06-174409 | 6/1994 |
| JP | A-06-324061 | 11/1994 |
| JP | A-H07-099114 | 4/1995 |
| JP | A-H07-249517 | 9/1995 |
| JP | A-08-75835 | 3/1996 |
| JP | A-08-178937 | 7/1996 |
| JP | A-09-063843 | 3/1997 |
| JP | 09318388 * | 12/1997 |
| JP | A-09-318388 | 12/1997 |
| JP | A-09-329619 | 12/1997 |
| JP | A-10-300763 | 11/1998 |
| JP | A-H11-109006 | 4/1999 |
| JP | A-11-230782 | 8/1999 |
| JP | A-2000-46513 | 2/2000 |
| JP | A-2001-004726 | 1/2001 |
| JP | A-2001-116773 | 4/2001 |
| JP | A-2001-221838 | 8/2001 |
| JP | A-2001-221839 | 8/2001 |
| JP | A-2001-228229 | 8/2001 |
| JP | A-2001-289926 | 10/2001 |
| JP | A-2001-289929 | 10/2001 |
| JP | A-2001-318131 | 11/2001 |
| JP | A-2003-056378 | 2/2003 |
| WO | WO 00/25371 | 5/2000 |

OTHER PUBLICATIONS

Office Action issued from Chinese Patent Office mailed on Aug. 5, 2005 for the corresponding Chinese patent application No. 200310118343X (a copy and English translation thereof).

Notice of Preliminary Rejection issued from Korean Patent Office issued on Apr. 21, 2006 for the corresponding Korean patent application No. 10-2006-0008570 (a copy and English translation thereof).

Notice of reason for Refusal from Japanese Patent Office issued on Aug. 29, 2006 for the corresponding Japanese patent application No. 2003-058900 (and English translation thereof).

Notice of reason for Refusal from Japanese Patent Office issued on Sep. 5, 2006 for the corresponding Japanese patent application No. 2003-058899 (and English translation thereof).

Decision for Refusal from Japanese Patent Office issued on Nov. 21, 2006 for the corresponding Japanese patent application No. 2003-058899 (and English translation thereof).

Decision for Refusal from Japanese Patent Office issued on Nov. 21, 2006 for the corresponding Japanese patent application No. 2003-058900 (and English translation thereof).

Notice of Reason for Refusal from Japanese Patent Office issued on Dec. 26, 2006 for the corresponding Japanese patent application No. 2003-073900(and English translation thereof).

Second Office Action dated Nov. 16, 2007 in corresponding Chinese Patent Application No. 200310118343X (and English translation).

Office Action mailed on Oct. 9, 2007 in the related U.S. Appl. No. 11/650,929.

Office Action mailed on Aug. 30, 2007 in the related U.S. Appl. No. 11/650,929.

Office Action dated Feb. 15, 2008 in corresponding Japanese Patent Application No. 2002-337416 (and English translation).

Office Action dated Feb. 15, 2008 in corresponding Japanese Patent Application No. 2002-337417 (and English translation).

Office Action dated may 27, 2008 in corresponding Japanese Patent Application No. 2002-337416 (and English translation).

Office Action dated May 27, 2008 in corresponding Japanese Patent Application No. 2002-337417 (and English translation).

Office Action Apr. 7, 2008 in corresponding U.S. Appl. No. 11/650,929.

Office Action dated Oct. 29, 2008 in corresponding U.S. Appl. No. 11/650,929.

* cited by examiner

FIG. 8

| DEVICE NO. | COMPOSITION | L3 ($\mu$m) | $\Delta Z/Z_0$ (%) | $\Delta Z_0/\Delta T$ (ppm/°C) | $\Delta(\Delta Z/Z_0)/\Delta T$ (ppm/°C) |
|---|---|---|---|---|---|
| S11 | $Ni_{81}Fe_{19}$ | 2 | 30 | 723 | -443 |
| S12 | $Ni_{81}Fe_{19}$ | 1 | 23 | 875 | 347 |
| S13 | $Ni_{84}Fe_{16}$ | 2 | 28 | 175 | 385 |
| S14 | $Ni_{78}Fe_{22}$ | 2 | 32 | 965 | 115 |
| S15 | $Ni_{90}Fe_{10}$ | 2 | 28 | -1276 | -1742 |
| S16 | $Ni_{65}Fe_{35}$ | 2 | 22 | 3388 | 2172 |
| S17 | $Co_{73}Si_{12}B_{15}$ | 2 | 2 | 4285 | -2414 |
| S18 | $Co_{85}Nb_{12}Zr_3$ | 2 | 6 | 275 | -513 |

FIG. 9

| DEVICE NO. | COMPOSITION | L1 ($\mu$m) | L2 ($\mu$m) | L3 ($\mu$m) | $\alpha$ =L1/L2 | $\beta$ =L2/L3 | $\Delta Z/Z_0$ (%) |
|---|---|---|---|---|---|---|---|
| S21 | $Ni_{81}Fe_{19}$ | 20 | 10 | 2 | 2 | 5 | 3 |
| S22 | $Ni_{81}Fe_{19}$ | 50 | 10 | 2 | 5 | 5 | 6 |
| S23 | $Ni_{81}Fe_{19}$ | 300 | 10 | 2 | 30 | 5 | 18 |
| S24 | $Ni_{81}Fe_{19}$ | 1000 | 10 | 2 | 100 | 5 | 23 |
| S25 | $Ni_{81}Fe_{19}$ | 10000 | 10 | 2 | 1000 | 5 | 36 |

FIG. 10
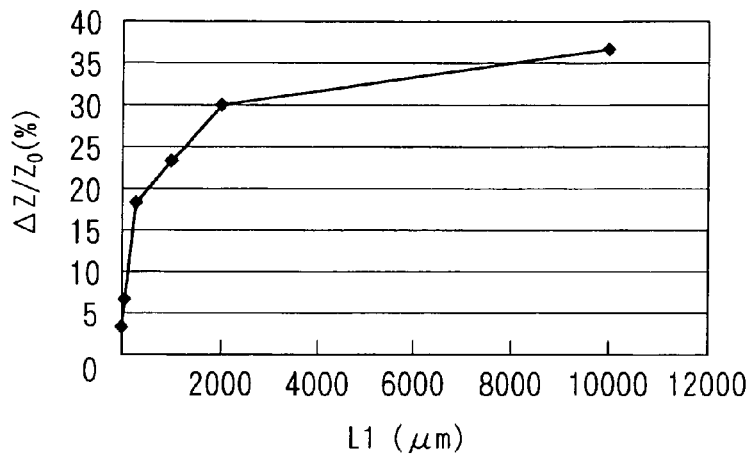
FIG. 11
| DEVICE NO. | COMPOSITION | L1 (μm) | L2 (μm) | L3 (μm) | α =L1/L2 | β =L2/L3 | ΔZ/Z₀ (%) |
|---|---|---|---|---|---|---|---|
| S31 | Ni₈₁Fe₁₉ | 2000 | 4 | 2 | 500 | 2 | 3 |
| S32 | Ni₈₁Fe₁₉ | 2000 | 7 | 2 | 286 | 3.5 | 29 |
| S33 | Ni₈₁Fe₁₉ | 2000 | 20 | 2 | 100 | 10 | 26 |
| S34 | Ni₈₁Fe₁₉ | 2000 | 50 | 2 | 40 | 25 | 21 |
| S35 | Ni₈₁Fe₁₉ | 2000 | 120 | 2 | 17 | 60 | 8 |
FIG. 12
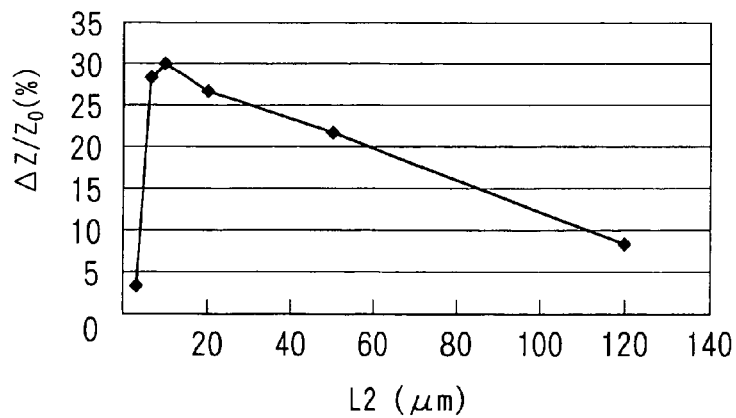

| DEVICE NO. | COMPOSITION | L1 ($\mu$m) | L2 ($\mu$m) | L3 ($\mu$m) | $\alpha$ =L1/L2 | $\beta$ =L2/L3 | $\Delta Z/Z_0$ (%) |
|---|---|---|---|---|---|---|---|
| S41 | $Ni_{81}Fe_{19}$ | 2000 | 10 | 0.15 | 200 | 67 | 4 |
| S42 | $Ni_{81}Fe_{19}$ | 2000 | 10 | 0.3 | 200 | 33.3 | 13 |
| S43 | $Ni_{81}Fe_{19}$ | 2000 | 10 | 0.5 | 200 | 20 | 18 |
| S44 | $Ni_{81}Fe_{19}$ | 2000 | 10 | 1 | 200 | 10 | 23 |
| S45 | $Ni_{81}Fe_{19}$ | 2000 | 10 | 2 | 200 | 5 | 30 |
| S46 | $Ni_{81}Fe_{19}$ | 2000 | 10 | 5 | 200 | 2 | 38 |

| DEVICE NO. | COMPOSITION | L3 ($\mu$m) | GRAIN SIZE (nm) | SURFACE ROUGHNESS (nm) | $\Delta Z/Z_0$(%) |
|---|---|---|---|---|---|
| S51 | $Ni_{81}Fe_{19}$ | 2 | 10 | 10 | 30 |
| S52 | $Ni_{81}Fe_{19}$ | 2 | 50 | 10 | 28 |
| S53 | $Ni_{81}Fe_{19}$ | 2 | 100 | 10 | 25 |
| S54 | $Ni_{81}Fe_{19}$ | 2 | 500 | 10 | 16 |
| S55 | $Ni_{81}Fe_{19}$ | 2 | 1500 | 10 | 6 |
| S56 | $Ni_{81}Fe_{19}$ | 2 | 3000 | 10 | 2 |

| DEVICE NO. | COMPOSITION | L3 (μm) | GRAIN SIZE (nm) | SURFACE ROUGHNESS (nm) | $\Delta Z/Z_0$ (%) |
|---|---|---|---|---|---|
| S61 | $Ni_{81}Fe_{19}$ | 2 | 10 | 5 | 30 |
| S62 | $Ni_{81}Fe_{19}$ | 2 | 10 | 50 | 30 |
| S63 | $Ni_{81}Fe_{19}$ | 2 | 10 | 150 | 27 |
| S64 | $Ni_{81}Fe_{19}$ | 2 | 10 | 500 | 18 |
| S65 | $Ni_{81}Fe_{19}$ | 2 | 10 | 1500 | 8 |
| S66 | $Ni_{81}Fe_{19}$ | 2 | 10 | 3000 | 6 |

FIG. 21

| DEVICE NO. | PROTECTION | L11 (μm) | σ (MPa) | BEFORE ΔZ/Z₀ (%) | AFTER ΔZ/Z₀ (%) |
|---|---|---|---|---|---|
| S201 | SiN | 0.1 | -120 | 30 | 8 |
| S202 | SiN | 0.3 | -200 | 30 | 30 |
| S203 | SiN | 0.5 | -100 | 32 | 32 |
| S204 | SiN | 1 | -800 | 16 | 15 |
| S205 | SiN | 1 | -120 | 30 | 30 |
| S206 | SiN | 1 | 400 | 12 | 14 |
| S207 | SiN | 2 | -300 | 28 | 28 |
| S208 | SiN | 2 | -50 | 30 | 30 |
| S209 | SiN | 5 | -180 | 25 | 25 |
| S210 | SiO₂ | 0.1 | 50 | 26 | 5 |
| S211 | SiO₂ | 0.5 | 10 | 32 | 32 |
| S212 | SiO₂ | 0.5 | 20 | 30 | 30 |
| S213 | SiO₂ | 1 | -1000 | 14 | 15 |
| S214 | SiO₂ | 1 | 30 | 28 | 28 |
| S215 | SiO₂ | 1 | 50 | 26 | 26 |
| S216 | SiO₂ | 1 | 350 | 14 | 15 |
| S217 | SiO₂ | 2 | 80 | 20 | 20 |
| S218 | SiO₂ | 3 | 50 | 30 | 30 |
| S219 | — | 0 | 0 | 30 | 8 |

METHOD FOR MANUFACTURING MAGNETIC SENSOR APPARATUS

CROSS REFERENCE TO RELATED APPLICATIONS

This application is a division of application Ser. No. 10/717,902 filed on Nov. 21, 2003, which is based on Japanese Patent Applications No. 2002-337416 filed on Nov. 21, 2002, No. 2002-337417 filed on Nov. 21, 2002, No. 2003-58899 filed on Mar. 5, 2003, No. 2003-58900 filed on Mar. 5, 2003, and No. 2003-73900 filed on Mar. 18, 2003, the disclosures of which are incorporated herein by reference. This application is also related to pending divisional application Ser. No. 11/650,929, filed on Jan. 9, 2007.

FIELD OF THE INVENTION

The present invention relates to a magnetic impedance device, a sensor apparatus using the same and a method for manufacturing the same. The sensor apparatus is suitably used for a rotation sensor apparatus.

BACKGROUND OF THE INVENTION

A conventional magnetic impedance device utilizes a magnetic impedance effect, and is disclosed in Japanese Patent Application Publication No. H08-75835. The magnetic impedance effect is that impedance of the device changes in accordance with an outside stress in a case where the device is energized with an alternating current (e.g., a high frequency alternating current, the frequency being higher than 1 MHz). The device includes a magnetic layer, which is made of amorphous alloy and has a soft magnetic property. Here, the amorphous alloy has high relative magnetic permeability. Therefore, a change of the magnetic permeability in the magnetic layer in accordance with an external magnetic field becomes large, so that the device has high sensitivity.

However, the magnetic impedance device with the magnetic layer made of amorphous alloy has low heat resistance, so that the sensitivity of the device is much decreased in a case where the device is processed with heat treatment above almost 400° C. The reason is as follows. The crystallization temperature of the magnetic layer made of amorphous alloy is low, i.e., at around 400° C. Therefore, when the device is processed with heat treatment above almost 400° C., the amorphous alloy is crystallized, so that the soft magnetic property of the amorphous alloy disappears. Here, the soft magnetic property of the amorphous alloy provides high sensitivity magnetic impedance.

Further, in a case where the magnetic layer is formed of easily oxidizable material, the magnetic layer is oxidized with heat treatment, so that the soft magnetic property is deteriorated. Thus, the sensitivity is decreased.

Therefore, it is difficult to manufacture the magnetic impedance device having the magnetic layer made of amorphous alloy with using a conventional semiconductor processing method. That is because the conventional method usually includes a step of heat treatment above almost 400° C. Accordingly, it is difficult to minimize the device with using the conventional method so that the device is integrated with another circuit such as a sensor output signal processor.

Further, when the device is annealed, i.e., processed with heat treatment, a stress is generated in a substrate since thermal expansion of the substrate is different from that of the device. Here, the device is mounted on the substrate. Therefore, in some cases, the device may be removed from the substrate. To prevent from being removed, deposition condition for depositing a magnetic layer composing a magnetic impedance device is changed, or a film quality of the magnetic layer is changed. This is disclosed in Japanese Patent Application Publication No. 2001-228229. However, this device is necessitated to form with limited manufacturing method and to have a limited construction.

Moreover, since a magnetic impedance device having high sensitivity is available for various sensor systems, minimization and low manufacturing cost are much required. For example, a magnetic impedance head module according to a prior art having a thin film magnetic impedance device is disclosed in Japanese Patent Application Publications No. 2001-318131. The head module includes the thin film magnetic impedance device, an electric power supply circuit for energizing the device with a high frequency alternating current, and a detection circuit for detecting a impedance change, which are provided with a discrete circuit. And each discrete circuit is combined with a hybrid IC. Therefore, minimization and reduction of manufacturing cost of the head module are limited.

Further, a magnetic impedance device is suitably used for a sensor apparatus mounted on an automotive vehicle, the sensor apparatus detecting, for example, rotation of a rotational body. A rotation sensor apparatus according to a prior art is disclosed in Japanese Patent Applications No. H08-304432 (i.e., U.S. Pat. No. 5,841,276) and No. 2000-46513. These sensor apparatuses are mounted on an engine of a vehicle or on a wheel hub, so that the sensor apparatuses detect rotation of crankshaft of the engine or rotation of wheel of the vehicle, respectively. In each case, it is required to minimize the sensor apparatus so as to improve mounting performance of the apparatus and to increase design freedom of an engine and so on.

Further, the magnetic impedance device mounted on the vehicle is required to be protected from outside disturbance of magnetic field with using a simple construction of the device. That is because the magnetic impedance device has high sensitivity so that the device is easily affected by the outside disturbance of magnetic field. Therefore, a current sensor having a magnetic impedance device according to a prior art, for example, includes a magnetic shield and a pair of reverse wound coil for reducing the outside disturbance. This type of current sensor is disclosed in Japanese Patent Application Publication No. 2001-116773. However, this current sensor has a complicated construction so that a manufacturing cost is increased.

SUMMARY OF THE INVENTION

In view of the above problem, it is an object of the present invention to provide a sensor apparatus having a magnetic impedance device, which has minimum size and is made with low manufacturing cost. Specifically, the magnetic impedance device has high heat resistance. Namely, magnetic property of the device, i.e., sensor sensitivity is not decreased even when the device is processed with heat treatment. More specifically, the sensor apparatus is suitably used for a rotation sensor having high mounting performance and high design freedom.

It is another object of the present invention to provide a method for manufacturing the above sensor apparatus with a magnetic impedance device, which has minimum size and is made with low manufacturing cost.

It is further another object of the present invention to provide a sensor apparatus having a magnetic impedance device, which has high resistance against an outside disturbance of magnetic field. Specifically, the sensor apparatus is suitably used for a rotation sensor mounted, for example, on an automotive vehicle.

A magnetic sensor apparatus includes a semiconductor substrate and a magnetic impedance device for detecting a magnetic field. The magnetic impedance device is disposed on the substrate. This magnetic sensor apparatus has minimum size and is made with low manufacturing cost.

Further, a method for manufacturing the above magnetic sensor apparatus includes the steps of forming a stress relaxation layer on the substrate, and forming the magnetic impedance device on the stress relaxation layer. The stress relaxation layer reduces a stress generated in the substrate in a case where the apparatus is processed in a heat treatment. This method provides the magnetic sensor apparatus having minimum size and being made with low manufacturing cost. Further, the reliability of the apparatus concerned with a mechanical strength is improved.

Preferably, in the above apparatus, the magnetic impedance device detects a magnetic field in such a manner that impedance of the device is changed in accordance with the magnetic filed when an alternating current is applied to the device and the impedance is measured by an external electric circuit. The magnetic impedance device includes a magnetic layer made of Ni—Fe series alloy film. The magnetic layer has a length defined as L1 in an energization direction of the alternating current, a width defined as L2 in a perpendicular direction perpendicular to the energization direction, and a thickness of the magnetic layer defined as L3. The ratio of the length and the width is defined as $\alpha$, i.e., $\alpha=L1/L2$, and the ratio of the width and the thickness is defined as $\beta$, i.e., $\beta=L2/L3$. The ratio $\alpha$ is equal to or larger than 10, and the ratio $\beta$ is in a range between 1 and 50. The thickness L3 is equal to or larger than 5 µm.

In the above apparatus, the sensor sensitivity is not decreased even when the apparatus is processed with heat treatment. Thus, the apparatus has high heat resistance. Further, the apparatus has high sensor sensitivity.

Preferably, the apparatus further includes a protection layer for covering the magnetic layer. The protection layer is made of electrically insulation material. More preferably, the protection layer has a compression stress as an internal stress, the compression stress being equal to or smaller than 500 MPa. More preferably, the protection layer has a tensile stress as an internal stress, the tensile stress being equal to or smaller than 100 MPa. In the above apparatus, the sensor sensitivity is not decreased even when the apparatus is processed with heat treatment. Thus, the apparatus has high heat resistance. Specifically, the magnetic layer of the apparatus is not substantially oxidized even when the apparatus is annealed. Further, the apparatus has high sensor sensitivity.

Further, a rotation sensor apparatus includes a rotation body for providing a periodic change of intensity of magnetic field disposed around the rotation body in accordance with rotation of the rotation body, a magnetic sensor having a magnetic impedance device for detecting the periodic change of the intensity of magnetic field so as to detect the rotation of the rotation body, and a separation shield for separating between the rotation body and the magnetic sensor. The magnetic sensor detects the rotation of the rotation body through the separation shield.

In the above rotation sensor apparatus, the magnetic sensor having high sensor sensitivity can detect the rotation of the rotation body, even though the separation shield is disposed between the magnetic sensor and the rotation body. Therefore, the magnetic sensor can be disposed outside the separation shield without drilling an opening for mounting the magnetic sensor. Thus, the apparatus has high mounting performance for mounting the magnetic sensor on the separation shield and high design freedom of the separation shield.

Preferably, the separation shield is a casing for covering the rotation body. The magnetic sensor detects the rotation of the rotation body disposed in the casing.

Preferably, the rotation sensor apparatus further includes another magnetic sensor. The two magnetic sensors are arranged in parallel so as to separate by a half of pitch of the rotation body and symmetrically disposed around a rotation axis of the rotation body. The two magnetic sensors output signals, respectively, so that a differential output signal is obtained. In this case, the apparatus detects a differential output generated from both magnetic sensors. This differential output cancels a constant component of the geomagnetic field disposed in each magnetic sensor. Therefore, the apparatus detects the periodic change of magnetic field much accurately. Namely, the apparatus detects the rotation much accurately.

Preferably, the separation shield is a sensor casing for covering the magnetic sensor. The sensor casing is made of magnetic material and includes an opening, which faces the rotation body. The magnetic sensor detects the rotation of the rotation body through the opening of the sensor casing. In this case, the apparatus has a simple construction in such a manner that the sensor casing having the small opening covers the magnetic sensor so that the influence of disturbance of an external magnetic field around the magnetic sensor is reduced. Therefore, the manufacturing cost of the apparatus is reduced. Further, the apparatus having the magnetic impedance device, which has high resistance against an outside disturbance of magnetic field.

BRIEF DESCRIPTION OF THE DRAWINGS

The above and other objects, features and advantages of the present invention will become more apparent from the following detailed description made with reference to the accompanying drawings. In the drawings:

FIG. 8 is a table showing coefficients of temperature dependence of the magnetic impedance $\Delta Zo/\Delta T$ at zero magnetic field and of the sensor sensitivity $\Delta(\Delta Z/Zo)/\Delta T$ in different devices, according to the first embodiment;

FIG. 9 is a table showing the ratio of impedance change $\Delta Z/Zo$ in different devices, according to the first embodiment;

FIG. 10 is a graph showing a relationship between a length L1 of the magnetic layer and a ratio of impedance change ΔZ/Zo in the devices according to the first embodiment;

FIG. 11 is a table showing the ratio of impedance change ΔZ/Zo in different devices, according to the first embodiment;

FIG. 12 is a graph showing a relationship between a width L2 of the magnetic layer and a ratio of impedance change ΔZ/Zo in the devices according to the first embodiment;

FIG. 21 is a table showing the ratio of impedance change ΔZ/Zo in different devices, according to the second embodiment;

DETAILED DESCRIPTION OF THE PREFERRED EMBODIMENTS

First Embodiment

The inventors examine a magnetic thin film made of Ni—Fe series alloy as a magnetic material composing a magnetic layer in a magnetic impedance device, which has high heat resistance so that sensitivity of the device is not decreased even when the device is processed with heat treatment above 400° C.

A magnetic impedance device according to a first embodiment utilizes magnetic impedance effect. The magnetic impedance effect is that impedance of the device changes in accordance with an external magnetic field when the device is energized with an alternating current. The device includes a magnetic layer made of Ni—Fe series alloy film. Here, Ni—Fe series alloy film has high Currie temperature and is made of polycrystalline. Accordingly, magnetic property of the magnetic layer made of Ni—Fe series alloy film does not change after the heat treatment above 400° C. For example, sensor sensitivity of the device is not decreased after the heat treatment. Therefore, the device has high heat resistance.

Figure 1:
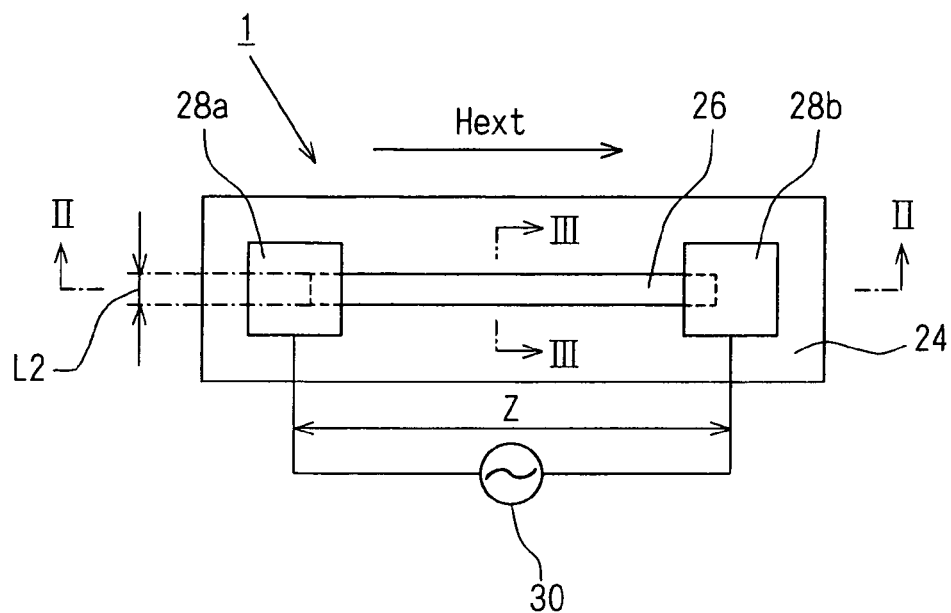
FIG. 1 is a plan view showing a magnetic impedance device according to a first embodiment of the present invention.
Figure 2:
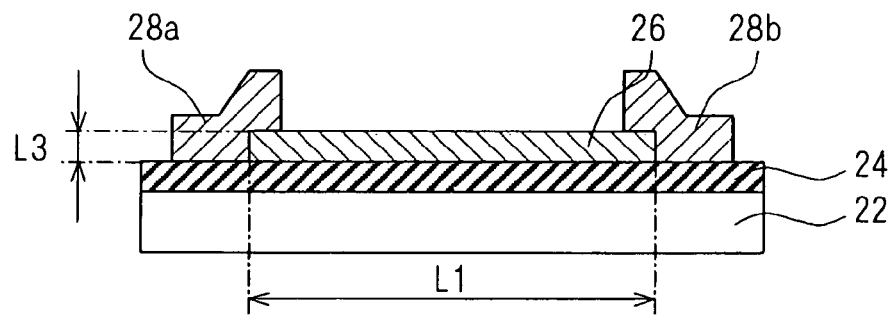
FIG. 2 is a cross-sectional view showing the device taken along line II-II in FIG. 1.
Figure 3:
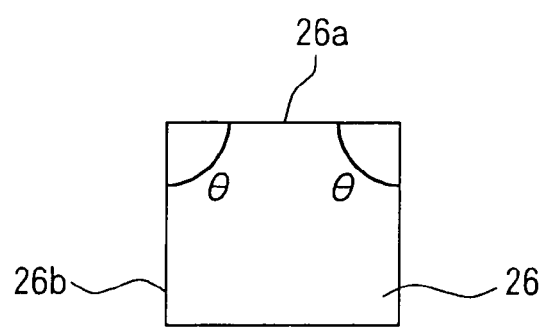
FIG. 3 is a cross-sectional view showing the device taken along line III-III in FIG. 1.

A magnetic impedance device 1 according to a first embodiment is shown FIGS. 1-3. As shown in FIGS. 1 and 2, the device 1 includes a substrate 22, an insulation layer 24, a magnetic layer 26, and a pair of electrode pads 28a, 28b. The electrode pads 28a, 28b connect to an alternating current supply 30. The alternating current supply 30 can control a frequency of alternating current outputting from the supply 30. In FIG. 1, an external magnetic field Hext is applied to the device 1, and the alternating current outputted from the supply 30 also flows through the device 1. An energization direction of the alternating current outputted from the supply 30 is parallel to the external magnetic field Hext.

The substrate 22 can be made of any material as long as the insulation layer 24, the magnetic layer 26 and the like can be formed thereon. For example, the substrate is made of silicon wafer, glass, metal, and so on. In a case where the substrate 22 is made of conducting material or semiconducting material such as metal or silicon, it is preferred that the insulation layer 24 is disposed between the substrate 22 and the magnetic layer 26 so that the magnetic layer 26 is insulated from the substrate 22 electrically. In a case where the substrate 22 is made of insulation material such as glass, the magnetic layer 26 can be formed on the substrate 22 directly without the insulation layer 24. Further, other material such as a conducting layer other than the insulation layer 24 may be formed between the substrate 22 and the magnetic layer 26 in some case. Preferably, surface roughness of the substrate 22 is lower than 1 μm. In this case, concavity and convexity of the surface of the substrate 22 is small, and the magnetic layer 26 is disposed on the substrate 22 directly or disposed on the substrate 22 through the insulation layer 24 and the like, so that the magnetic layer 26 can be magnetized easily. Specifically, the magnetic layer 26 has an excellent soft magnetic property. Further, the insulation layer 24 can be made of any insulation material as long as the insulation layer 24 insulates between the substrate 22 and the magnetic layer 26. For example, the insulation layer 24 is made of oxide silicon, nitride silicon, and the like.

The magnetic layer 26 is formed on the insulation layer 24. The magnetic layer 26 is made of Ni—Fe series alloy film, which is a thin film and made of ferromagnetic material having a soft magnetic property. The Ni—Fe series alloy film is made of Ni and Fe only, i.e., Ni—Fe alloy. However, the magnetic layer 26 can be made of Fe—Co alloy and the like. Preferably, composition of Ni—Fe series alloy composing the magnetic layer 26 is 65-90 wt % of Ni and/or 15-35 wt % of Fe. In a case where the Ni—Fe series alloy is made of Ni and Fe only, it is preferred that the composition is 65-90 wt % of Ni and/or 15-35 wt % of Fe. In this case, the sensor sensitivity is improved. More preferably, composition of Ni—Fe series alloy composing the magnetic layer 26 is 77-85 wt % of Ni and/or 15-23 wt % of Fe. In a case where the Ni—Fe series alloy is made of Ni and Fe only, it is preferred that the composition is 77-85 wt % of Ni and/or 15-23 wt % of Fe. In the above cases, the temperature dependence of magnetic permeability of the magnetic layer 26 becomes small, so that the magnetic impedance device 1 has high sensor sensitivity and low temperature dependence of the sensitivity.

As shown in FIG. 3, the cross-section of the magnetic layer 26 has a square shape, the cross-section being perpendicular to the energization direction. The cross-section of the magnetic layer 26 has a latitudinal side 26a and a longitudinal side 26b. An angle θ between the latitudinal side 26a and the longitudinal side 26b is preferably in a range between 60° and 120°. In this case, wedge-shaped magnetic domain is prevented from generating. Therefore, a hysteresis loop in the magnetic impedance characteristic of the magnetic layer 26 is also prevented from generating. More preferably, the angle θ is in a range between 85° and 95°.

Grain size of a single crystalline particle of the Ni—Fe series alloy composing the magnetic layer 26 is preferably in a range between 1 nm and 1 μm. If the grain size is smaller than 1 nm, the grain size becomes larger when the device is performed with heat treatment. Therefore, the soft magnetic property is easily deteriorated. If the grain size is larger than 1 μm, it is difficult to magnetize the magnetic layer 26 so as to have the soft magnetic property. Moreover, it is preferred that the magnetic layer 26 has an axis of easy magnetization, which is almost perpendicular to or parallel to the energization direction of the alternating current from the alternating current supply 30. In this case, the detection sensitivity for detecting the external magnetic field is improved. Further, it is preferred that the magnetic properties of the magnetic layer 26 are such that the coercive force is lower than 10 Oe and the relative magnetic permeability is higher than 500.

As shown in FIGS. 1 and 2, the magnetic layer 26 has a length L1 in the energization direction of the alternating current, a width L2 perpendicular to the energization direction, and a thickness L3 of the magnetic layer 26. Assuming that a ratio between the length L1 and the width L2 is defined as α, i.e., α=L1/L2, and a ratio between the width L2 and the thickness L3 is defined as β, i.e., β=L2/L3, the ratio α is equal to or larger than 10 and the ratio β is in a range between 1 and 50 (i.e., α≧10 and 1≦β≦50). Further, the thickness L3 is equal to or larger than 5 μm. In this case, the magnetic impedance device has high sensor sensitivity. That is because the magnetic domain of the magnetic layer 26 can be controlled accurately so that the magnetic permeability of the magnetic layer 26 is largely changed in accordance with the external magnetic field in a case where the magnetic layer 26 has the above construction.

More preferably, when the ration α is equal to or larger than 50, the sensor sensitivity is much improved. Further, when the ratio β is in a range between 1 and 30, the sensor sensitivity is much improved. Specifically, the ratio β is in a range between 1 and 5, the sensitivity is further improved. The above reasons are described later.

The electrode pads 28a, 28b are formed on the insulation layer 24. Each electrode pad 28a, 28b covers one end or the other end of the magnetic layer 26 in the longitudinal direction. The electrode pad 18a, 28b can be made of any material as long as the material works as an electrode. For example, the material is aluminum, copper and their alloy. It is preferred that the specific resistance of the electrode pad 28a, 28b is equal to or lower than 10 μΩ·cm.

Figure 4A:
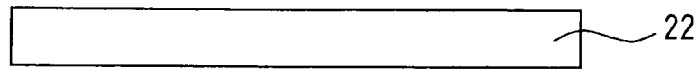
FIGS. 4A to 4C are cross-sectional views of the device explaining a manufacturing method of the device according to the first embodiment.
Figure 4B:
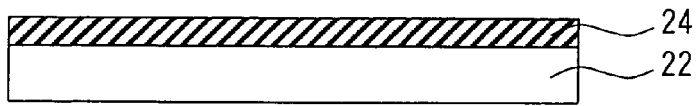
Figure 4C:
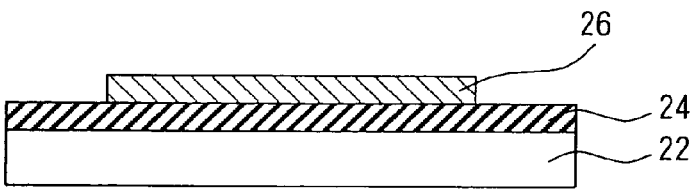

Next, the manufacturing method of the magnetic impedance device 1 is describes as follows. At first, as shown in FIGS. 4A to 4C, the substrate 22 is prepared. Then, the insulation layer 24 is formed on the substrate 22. When the substrate 22 is made of silicon, the surface of the silicon substrate 22 is oxidized with using thermal oxidation method so that the insulation layer 24 made of silicon oxides is formed. Further, the insulation layer 24 can be formed with using chemical vapor deposition method, sputtering method, or the like, and is made of silicon oxides, silicon nitrides. There is no limitation of the deposition method for forming the insulation layer 24.

Next, the Ni—Fe series alloy film is formed on the insulation layer 24. The Ni—Fe series alloy film can be formed with using sputtering method, vapor deposition, or coating method. There is no limitation of the deposition method for forming the Ni—Fe series alloy. The Ni—Fe series alloy film is patterned into a predetermined shape with using photo etching method, so that the magnetic layer 26 is formed, as shown in FIG. 4C. In this case, preferably a single axial anisotropic magnetic field is applied to the magnetic layer 26 in the energization direction of the alternating current, i.e., the longitudinal direction of the magnetic layer 26 during the deposition under magnetic filed or heat treatment under magnetic field, so that the magnetic layer 26 has the axis of easy magnetization along with the energization direction.

Next, a preliminary layer for an electrode is formed on both the magnetic layer 26 and the insulation layer 24. The preliminary layer can be formed with using the sputtering method, vapor deposition, or coating method. There is no limitation of the deposition method for forming the preliminary layer. The preliminary layer is patterned into a predetermined shape with using photo etching method, so that the electrode pads 28a, 28b are formed so as to cover both ends of the magnetic layer 26, as shown in FIGS. 1 and 2. Then, the electrodes 28a, 28b is connected with bonding wires. Thus, the magnetic impedance device 1 is completed.

Specifically, the detailed manufacturing method is described as follows. A magnetic impedance device S11 (that is shown in FIG. 8) according to this embodiment is manufactured. As shown in FIG. 4, the silicon substrate 22 is prepared. The insulation layer 24 made of silicon oxides having thickness of 1 μm is formed on the substrate 22 with using the thermal oxidation method.

Next, a $Ni_{81}Fe_{19}$ Alloy film having thickness of 2 μm is formed on the insulation layer 24 with using the sputtering method under magnetic field. The $Ni_{81}Fe_{19}$ Alloy film is patterned into a predetermined shape with using the photo etching method, so that the magnetic layer 26 is formed. Specifically, the magnetic layer 26 has a length of 2 mm and a width of 10 μm. At this time, the single axial anisotropic magnetic field is applied to the magnetic layer 26 in the energization direction of the alternating current, i.e., the longitudinal direction of the magnetic layer 26 during the deposition of sputtering under magnetic filed, so that the magnetic layer 26 has the axis of easy magnetization along with the energization direction.

Next, an aluminum layer having thickness of 1 μm is formed on both the insulation layer 24 and the magnetic layer 26. The aluminum layer is patterned into a predetermined shape with using the photo etching method so that the electrode pads 28a, 28b are formed so as to cover both ends of the magnetic layer 26, as shown in FIGS. 1 and 2. Specifically, the area of each electrode pad 28a, 28b disposed on the upper surface of the electrode pad 28a, 28b is a square of 200 μm×200 μm. On the assumption that the device S11 is processed in semiconductor process, the device S11 is processed in vacuum under 400° C. during 30 minutes. After that, each electrode pad 28a, 28b is connected with a bonding wire. Thus, the device S11 is completed.

The device S11 is evaluated with using a coil and an impedance analyzer. Here, the coil provides an external magnetic field Hext applied to the device S11, and the impedance analyzer detects a high frequency impedance Z generated at both ends of the magnetic layer 26 of the device S11. The external magnetic field Hext is parallel to the energization direction of the high frequency alternating current generated from the alternating current supply 30. The external magnetic field Hext is corrected with a gauss meter disposed on the substrate 22. The impedance Z is measured in case of the frequency of the high frequency current supply 30 at 100 MHz. The magnetic impedance property of the device S11 is evaluated with a ratio of impedance change $$\frac{\Delta Z}{Zo}.$$

Here, Zo is impedance of the device S11 in a case where the external magnetic field Hext is zero. ΔZ is a difference between impedance Z in a case where the external magnetic field Hext is 100 Oe and the impedance Zo at zero, i.e., ΔZ=Z−Zo. The temperature dependence of the magnetic impedance of the device S11 is measured at −40° C. and +85° C. in a temperature controlled chamber, so that a coefficient of temperature dependence of magnetic impedance ΔZo/ΔT at zero magnetic field and a coefficient of temperature dependence of sensor sensitivity Δ(ΔZ/Zo)/ΔT are calculated. The coefficient of temperature dependence of magnetic impedance ΔZo/ΔT at zero magnetic field is a coefficient of temperature dependence of the impedance Z in case of the external magnetic field at zero. The coefficient of temperature dependence of sensor sensitivity Δ(ΔZ/Zo)/ΔT is a coefficient of temperature dependence of the ratio of impedance change ΔZ/Zo.

Figure 5:
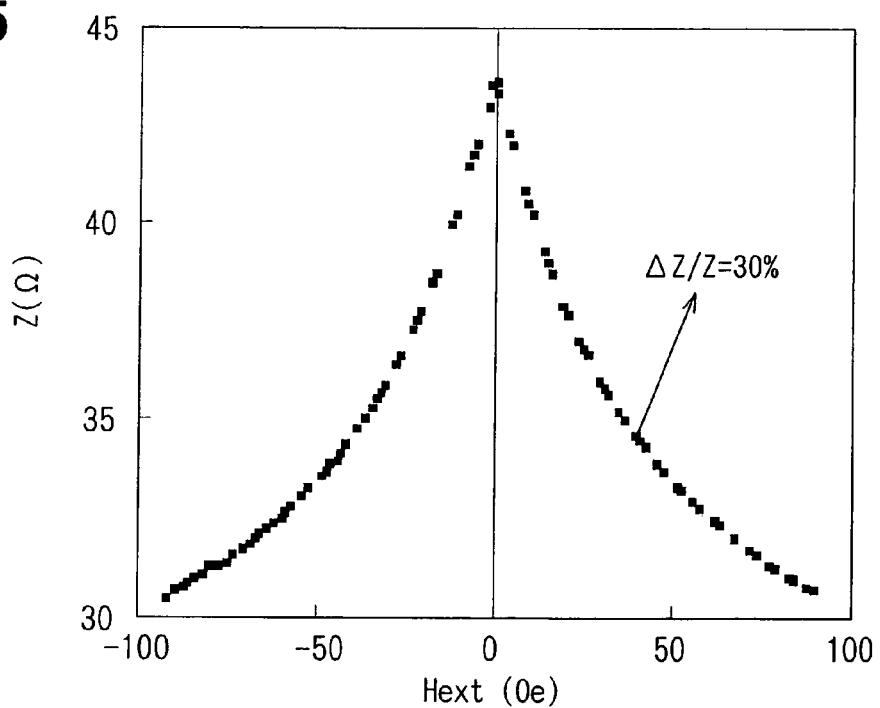
FIG. 5 is a graph showing a relationship between an external magnetic field Hext and impedance Z of the device according to the first embodiment.

FIG. 5 is a graph of magnetic impedance property of the device S11 showing an impedance change in accordance with the external magnetic field Hext. In case of the device S11, the impedance of the device S11 is reduced in accordance with increasing or decreasing the external magnetic field Hext. As shown in FIG. 5, the ration of impedance change ΔZ/Zo, which corresponds to the sensor sensitivity, is about 30%.

Figure 6:
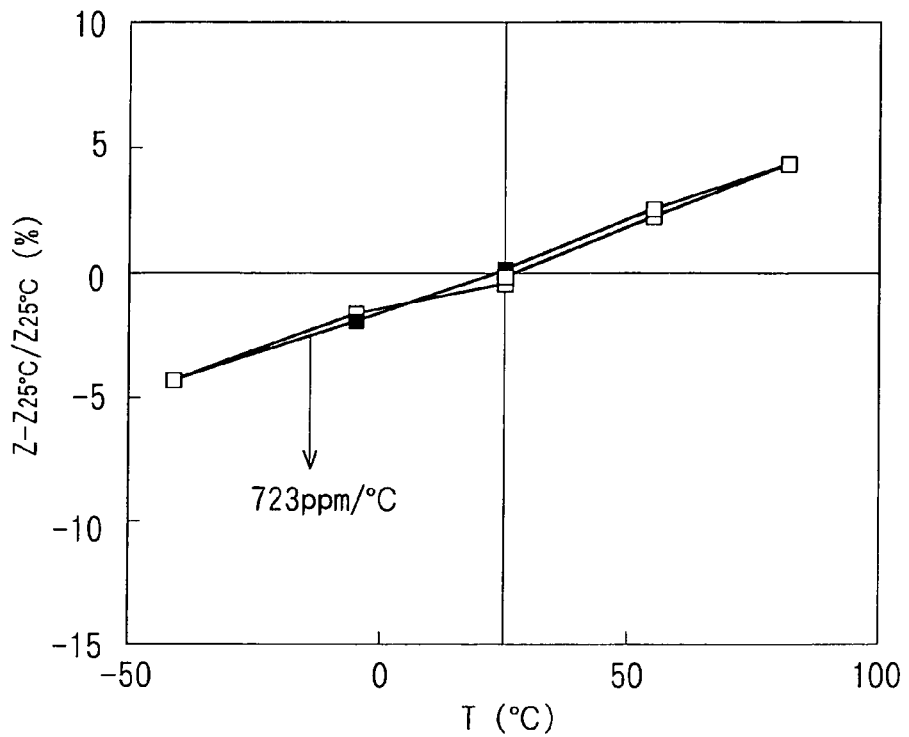
FIG. 6 is a graph showing a relationship between temperature T and temperature drift of impedance Z−Zat25° C./Zat25° C. at zero magnetic field of the device according to the first embodiment.

FIG. 6 shows a graph showing a relationship between temperature T and an impedance drift ΔZ/Z at zero magnetic field, i.e., Z−Zat25° C./Zat25° C., of the device S11. The coefficient of temperature dependence of magnetic impedance ΔZo/ΔT at zero magnetic field is calculated to be 723 ppm/° C. from a slope of a line of the relationship between temperature T and the impedance drift ΔZ/Z.

Figure 7:
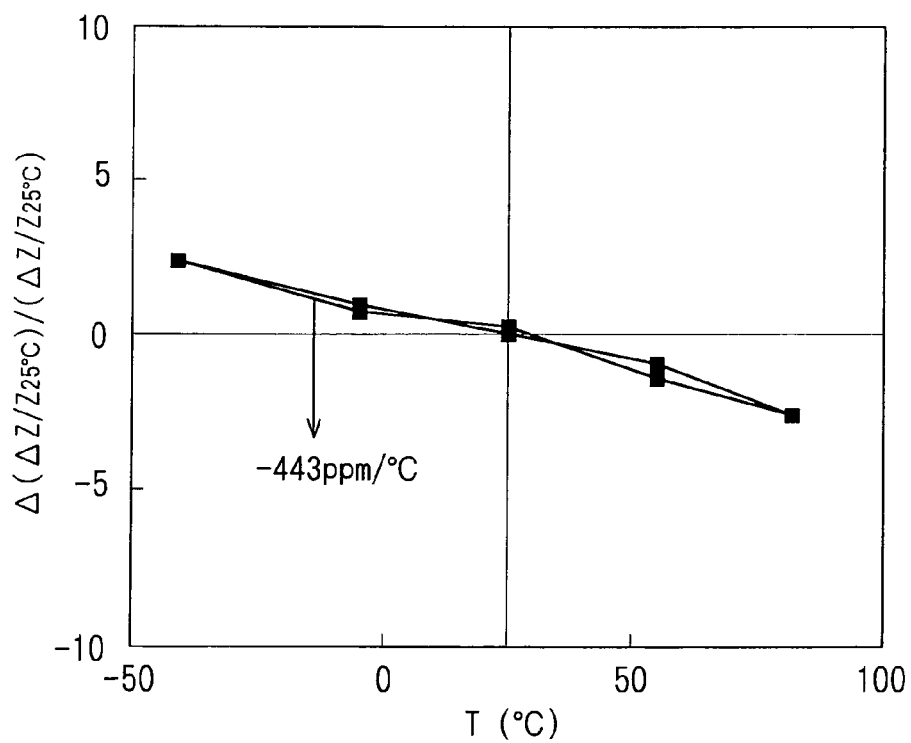
FIG. 7 is a graph showing a relationship between temperature T and temperature dependence of sensor sensitivity $\Delta$(Z−Zat25° C./Zat25° C.)/(Z−Zat25° C./Zat25° C.) of the device according to the first embodiment.

FIG. 7 shows a graph showing a relationship between temperature T and a sensor sensitivity drift $$\frac{\Delta\left(\frac{\Delta Z}{Z}\right)}{\left(\frac{\Delta Z}{Z}\right)},$$

i.e., Δ(Z−Zat25° C./Zat25° C.)/(Z−Zat25° C./Zat25° C.) of the device S11. The coefficient of temperature dependence of sensor sensitivity Δ(ΔZ/Zo)/ΔT is calculated to be −443 ppm/° C. from a slope of a line of the relationship between temperature T and the sensor sensitivity drift Δ(ΔZ/Z)/(ΔZ/Z).

In general, it is required that both of the coefficient of temperature dependence of sensor sensitivity Δ(ΔZ/Zo)/ΔT and the coefficient of temperature dependence of magnetic impedance ΔZo/ΔT at zero magnetic field are in a range between −1000 ppm/° C. to +1000 ppm/° C. Thus, both of the coefficients Δ(ΔZ/Zo)/ΔT, ΔZo/ΔT are preferably in a range between −1000 ppm/° C. to +1000 ppm/° C. Here, when the Ni—Fe alloy film has a composition of 77-85 wt % of Ni and/or 15-23 wt % of Fe, this requirement of the coefficients Δ(ΔZ/Zo)/ΔT, ΔZo/ΔT are satisfied.

Both of the coefficients Δ(ΔZ/Zo)/ΔT, ΔZo/ΔT of various devices S11-S18 are measured. As shown in FIG. 8, a device S12 has a different thickness of the magnetic layer 26, which is different from that of the device S11. Each device S13-S16 has the same construction as the device S1, and different composition of Ni and Fe, which is different from that of the device S11. Each device S17, S18 has the same construction as the device S1, and has a various magnetic layer 26 made of different materials, which is different from those of the device S1, specifically, the magnetic layer 26 of the device S17, S18 is made of amorphous alloy.

As shown in FIG. 8, each device S11-S14 has a high sensor sensitivity, i.e., high ratio of impedance change ΔZ/Zo that is higher than 20%, and low coefficients Δ(ΔZ/Zo)/ΔT, ΔZo/ΔT, i.e., low coefficients of temperature dependence of sensor sensitivity Δ(ΔZ/Zo)/ΔT and of magnetic impedance ΔZo/ΔT at zero magnetic field that are in a range between −1000 ppm/° C. and +1000 ppm/° C. On the other hand, the devices S15, S16 have the high sensor sensitivity that is higher than 20%, and the high coefficients Δ(ΔZ/Zo)/ΔT, ΔZo/ΔT that are disposed out of range between −1000 ppm/° C. and +1000 ppm/° C. That is because the devices S11-S14 have the magnetic layer 26 made of the Ni—Fe alloy film having a composition, which is disposed in a certain range of the low temperature dependence of the relative magnetic permeability of the magnetic layer 26. However, the devices S15, S16 have the magnetic layer 26 made of the Ni—Fe alloy film having a composition, which is disposed in a certain range of the high temperature dependence of the relative magnetic permeability of the magnetic layer 26.

Further, the devices S17, S18 have much small sensor sensitivity, which is much smaller than that of the devices S11-S16. That is because the devices S17, S18 have the magnetic layer 26 made of amorphous alloy, so that the magnetic layer 26 is crystallized in the heat treatment process performed at 400° C. Therefore, the soft magnetic property of the magnetic layer 26 is almost disappeared. The soft magnetic property provides the change of magnetic permeability in accordance with the external magnetic field.

FIG. 9 shows the ratio of impedance change $\Delta Z/Zo$ of various devices S21-S25, each of which has the magnetic layer 26 made of the same composition of Ni and Fe as that of the device S11 (i.e., $Ni_{81}Fe_{19}$). Each device S21-S25 has the magnetic layer 26 having a thickness L3 of 2 µm, a width L2 of 10 µm, and a different length L1. FIG. 9 also shows the ratio $\alpha$ (i.e., $\alpha=L1/L2$) and the ratio $\beta$ (i.e., $\beta=L2/L3$). FIG. 10 is a graph showing a relationship between the length L1 and the ratio of impedance change $\Delta Z/Zo$ of the various devices S21-S25.

As shown in FIGS. 9 and 10, as the length L1 of the magnetic layer 26 becomes longer, the ratio of impedance change $\Delta Z/Zo$ becomes large. In the above devices S21-S25, the ratio $\beta$ is 5. When the ratio $\alpha$ is equal to or larger than 10, i.e., the length L1 is equal to or longer than 100 µm, the ratio of impedance change $\Delta Z/Zo$ is larger than 10%. Further, when the ratio $\alpha$ is equal to or larger than 50, i.e., the length L1 is equal to or longer than 500 µm, the ratio of impedance change $\Delta Z/Zo$ is larger than 20%. Furthermore, when the ratio $\alpha$ is equal to or larger than 200, i.e., the length L1 is equal to or longer than 2000 µm, the ratio of impedance change $\Delta Z/Zo$ is larger than 30%. Here, it is preferred that the ratio of impedance change $\Delta Z/Zo$ becomes larger.

FIG. 11 shows the ratio of impedance change $\Delta Z/Zo$ of various devices S31-S35, each of which has the magnetic layer 26 made of the same composition of Ni and Fe as that of the device S11 (i.e., $Ni_{81}Fe_{19}$). Each device S31-S35 has the magnetic layer 26 having a thickness L3 of 2 µm, a length L1 of 2000 µm, and a different width L2. FIG. 11 also shows the ratio $\alpha$ (i.e., $\alpha=L1/L2$) and the ratio $\beta$ (i.e., $\beta=L2/L3$). FIG. 12 is a graph showing a relationship between the width L2 and the ratio of impedance change $\Delta Z/Zo$ of the various devices S31-S35.

As shown in FIGS. 11 and 12, in a case where the width L2 is longer than 10 µm, as the width L2 of the magnetic layer 26 becomes longer, the ratio of impedance change $\Delta Z/Zo$ becomes small. In a case where the width L2 is shorter than 10 µm, as the width L2 of the magnetic layer 26 becomes shorter, the ratio of impedance change $\Delta Z/Zo$ becomes small rapidly. When the ratio $\alpha$ is in a range between 20 and 400 and the ratio $\beta$ is in a range between 1 and 5, i.e., the width L2 is in a range between 5 µm and 100 µm, the ratio of impedance change $\Delta Z/Zo$ is larger than 10%. Further, when the ratio $\alpha$ is in a range between 33.3 and 333.3 and the ratio $\beta$ is in a range between 1.2 and 30, i.e., the width L2 is in a range between 6 µm and 60 µm, the ratio of impedance change $\Delta Z/Zo$ is larger than 20%. Furthermore, when the ratio $\alpha$ is in a range between 166.7 and 250 and the ratio $\beta$ is in a range between 1.6 and 2.4, i.e., the width L2 is in a range between 8 µm and 12 µm, the ratio of impedance change $\Delta Z/Zo$ is larger than 30%. Here, it is preferred that the ratio of impedance change $\Delta Z/Zo$ becomes larger.

Figures 13, 14:
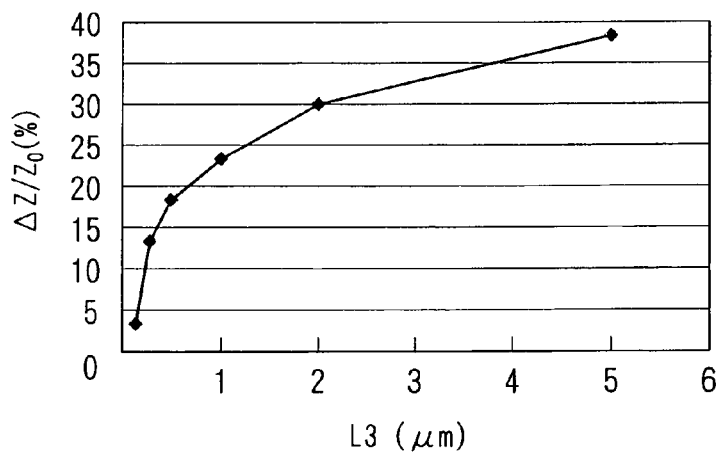
FIG. 13 is a table showing the ratio of impedance change ΔZ/Zo in different devices, according to the first embodiment.
FIG. 14 is a graph showing a relationship between a thickness L3 of the magnetic layer and a ratio of impedance change ΔZ/Zo in the devices according to the first embodiment.

FIG. 13 shows the ratio of impedance change $\Delta Z/Zo$ of various devices S41-S46, each of which has the magnetic layer 26 made of the same composition of Ni and Fe as that of the device S11 (i.e., $Ni_{81}Fe_{19}$). Each device S41-S46 has the magnetic layer 26 having a width L2 of 10 µm, a length L1 of 2000 µm, and a different thickness L3. FIG. 13 also shows the ratio $\alpha$ (i.e., $\alpha=L1/L2$) and the ratio $\beta$ (i.e., $\beta=L2/L3$). FIG. 14 is a graph showing a relationship between the thickness L3 and the ratio of impedance change $\Delta Z/Zo$ of the various devices S41-S46.

As shown in FIGS. 13 and 14, as the thickness L3 of the magnetic layer 26 becomes thicker, the ratio of impedance change $\Delta Z/Zo$ becomes large. Here, the ratio $\alpha$ is 200. When the ratio $\beta$ is equal to or smaller than 33, i.e., the thickness L3 is equal to or larger than 0.3 µm, the ratio of impedance change $\Delta Z/Zo$ is larger than 10%. Further, when the ratio $\beta$ is equal to or smaller than 14, i.e., the thickness L3 is equal to or larger than 0.7 µm, the ratio of impedance change $\Delta Z/Zo$ is larger than 20%. Furthermore, when the ratio $\beta$ is equal to or smaller than 5, i.e., the thickness L3 is equal to or larger than 2 µm, the ratio of impedance change $\Delta Z/Zo$ is larger than 30%.

In the above devices S11-S18, S21-S25, S31-S35, S41-S46 shown in FIGS. 8 to 14, it is preferred that the length L1, the width L2 and the thickness L3 have the following values.

Preferably, referring to the devices S22, S23, when the length L1 is equal to or longer than 200 µm, the width L2 is in a range between 7 µm and 20 µm, and the thickness L3 is equal to or larger than 2 µm, i.e., the ratio $\alpha$ is in a range between 10 and 28.6 and the ratio $\beta$ is in a range between 3.5 and 10, the ratio of impedance change $\Delta Z/Zo$ is equal to or larger than 10%. Preferably, referring to the devices S31, S35, when the length L1 is equal to or longer than 2000 µm, the width L2 is in a range between 5 µm and 50 µm, and the thickness L3 is equal to or larger than 2 µm, i.e., the ratio $\alpha$ is in a range between 40 and 400 and the ratio $\beta$ is in a range between 2.5 and 25, the ratio of impedance change $\Delta Z/Zo$ is equal to or larger than 10%. Preferably, referring to the devices S41, S42, when the length L1 is equal to or longer than 2000 µm, the width L2 is in a range between 7 µm and 15 µm, and the thickness L3 is equal to or larger than 0.3 µm, i.e., the ratio $\alpha$ is in a range between 133.3 and 258.7 and the ratio $\beta$ is in a range between 23.3 and 50, the ratio of impedance change $\Delta Z/Zo$ is equal to or larger than 10%.

More preferably, referring to the devices S23, S24, S34, when the length L1 is equal to or longer than 1000 µm, the width L2 is in a range between 7 µm and 50 µm, and the thickness L3 is equal to or larger than 2 µm, i.e., the ratio $\alpha$ is in a range between 20 and 142.9 and the ratio $\beta$ is in a range between 3.5 and 10, the ratio of impedance change $\Delta Z/Zo$ is equal to or larger than 20%. In this case, it is much preferred that the width L2 is in a range between 7 µm and 20 µm. Preferably, referring to the device S43, when the length L1 is equal to or longer than 2000 µm, the width L2 is in a range between 7 µm and 20 µm, and the thickness L3 is equal to or larger than 0.5 µm, i.e., the ratio $\alpha$ is in a range between 100 and 285.7 and the ratio $\beta$ is in a range between 14 and 40, the ratio of impedance change $\Delta Z/Zo$ is equal to or larger than 20%.

Much more preferably, referring to the devices S25, S32, S45, when the length L1 is equal to or longer than 2000 µm, the width L2 is in a range between 7 µm and 20 µm, and the thickness L3 is equal to or larger than 2 µm, i.e., the ratio $\alpha$ is in a range between 100 and 285.7 and the ratio β is in a range between 3.5 and 10, the ratio of impedance change ΔZ/Zo is equal to or larger than 30%.

Figures 15, 16:
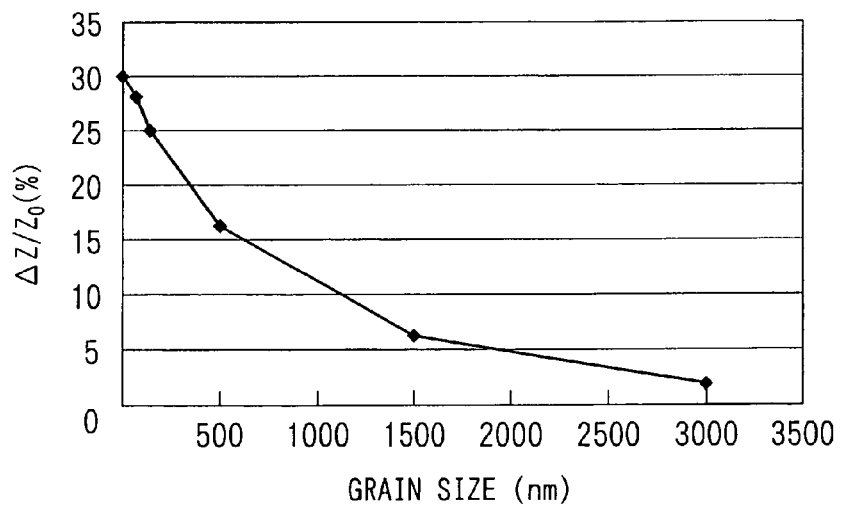
FIG. 15 is a table showing the ratio of impedance change ΔZ/Zo in different devices, according to the first embodiment.
FIG. 16 is a graph showing a relationship between a grain size of the magnetic layer and a ratio of impedance change ΔZ/Zo in the devices according to the first embodiment.

FIG. 15 shows the ratio of impedance change ΔZ/Zo of various devices S51-S56, each of which has the magnetic layer 26 made of the same composition of Ni and Fe as that of the device S11 (i.e., $Ni_{81}Fe_{19}$). Each device S51-S56 has the magnetic layer 26 having a length L1 of 2000 μm a width L2 of 10 μm, a thickness L3 of 2 μm, and a different grain size. Here, each device has a surface roughness of the substrate 22 of 2 nm. FIG. 16 is a graph showing a relationship between the grain size and the ratio of impedance change ΔZ/Zo of the various devices S51-S56.

As shown in FIGS. 15 and 16, as the grain size of the magnetic layer 26 becomes smaller, the ratio of impedance change ΔZ/Zo becomes large. When the grain size is equal to or smaller than 1100 nm, the ratio of impedance change ΔZ/Zo is larger than 10%. Further, when the grain size is equal to or smaller than 350 nm, the ratio of impedance change ΔZ/Zo is larger than 20%. Furthermore, when the grain size is equal to or smaller than 10 nm, the ratio of impedance change ΔZ/Zo is larger than 30%.

Figures 17, 18:
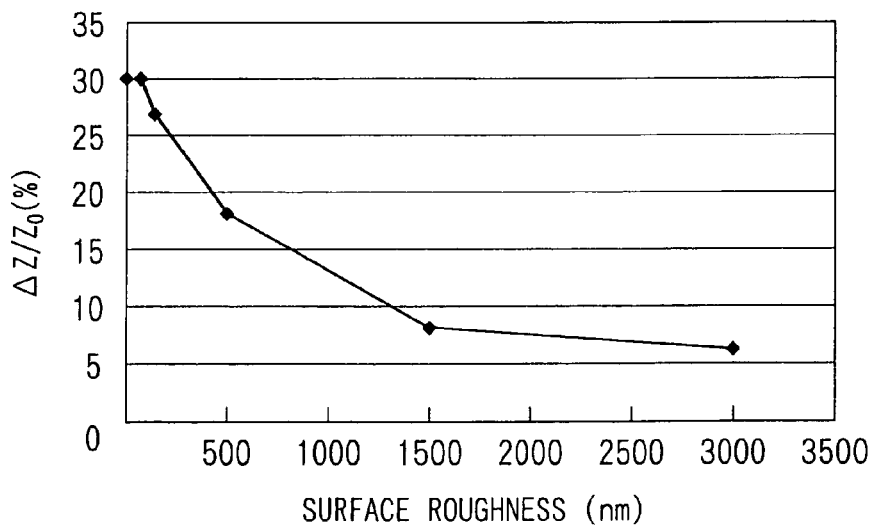
FIG. 17 is a table showing the ratio of impedance change in different devices, according to the first embodiment.
FIG. 18 is a graph showing a relationship between a surface roughness of the substrate and a ratio of impedance change ΔZ/Zo in the devices according to the first embodiment.

FIG. 17 shows the ratio of impedance change ΔZ/Zo of various devices S61-S66, each of which has the magnetic layer 26 made of the same composition of Ni and Fe as that of the device S11 (i.e., $Ni_{81}Fe_{19}$). Each device S61-S66 has the magnetic layer 26 having a length L1 of 2000 μm a width L2 of 10 μm, a thickness L3 of 2 μm, and a grain size of 10 nm. Each device has a different surface roughness of the substrate 22. FIG. 18 is a graph showing a relationship between the surface roughness and the ratio of impedance change ΔZ/Zo of the various devices S61-S66.

As shown in FIGS. 17 and 18, as the surface roughness of the substrate 22 becomes smaller, the ratio of impedance change ΔZ/Zo becomes large. When the surface roughness is equal to or smaller than 1300 nm, the ratio of impedance change ΔZ/Zo is larger than 10%. Further, when the surface roughness is equal to or smaller than 400 nm, the ratio of impedance change ΔZ/Zo is larger than 20%. Furthermore, when the surface roughness is equal to or smaller than 50 nm, the ratio of impedance change ΔZ/Zo is larger than 30%.

In the above devices having a certain construction, the sensor sensitivity is not decreased even when the device is processed with heat treatment. Thus, the device according to the first embodiment has high heat resistance. Further, the device has high sensor sensitivity.

Second Embodiment

Figure 19:
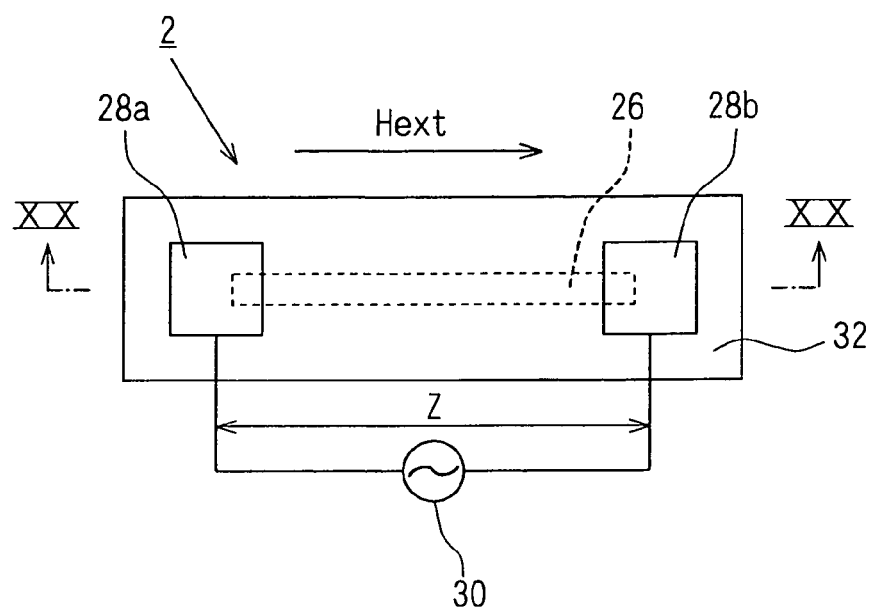
FIG. 19 is a plan view showing a magnetic impedance device according to a second embodiment of the present invention.

A magnetic impedance device 2 according to a second embodiment of the present invention includes the magnetic layer 26 and a protection layer 32, as shown in FIG. 19. The protection layer 32 covers the magnetic layer 26, and is made of electrically insulation material.

In general, a magnetic impedance device includes a magnetic layer having zero magneto-striction or low magneto-striction. This is because the magnetic layer having low magneto-striction is prevented from changing the magnetic properties generated by a striction of the magnetic layer, for example, from reducing the sensor sensitivity or the detection accuracy. However, the inventors obtain the following experimental results. In the device having a protection layer for covering the magnetic layer, an internal stress σ in the protection layer affects the magnetic properties of the magnetic layer, so that the sensor sensitivity is reduced. Further, there is a different influence of the internal stress σ affecting the magnetic properties of the magnetic layer between a case where the internal stress σ of the protection layer is a compression stress and a case where the internal stress σ is a tensile stress.

Considering the above experimental result, the device 2 according to the second embodiment includes the substrate 22, the insulation layer 24, the magnetic layer 26, a pair of electrode pads 28a, 28b and the protection layer 32. The external magnetic field Hext is applied to the device 2 along with the energization direction of the alternating current.

Although the magnetic layer id made of NI—Fe series alloy film, the magnetic layer 26 can be formed of linear shaped or thin film type amorphous alloy such as Co—Nb—Zr alloy, Co—Si—B alloy, and the like. There is no limitation of the shape of the magnetic layer 26.

The protection layer 32 covers the surface of the magnetic layer 26 and the surface of the insulation layer 24. The electrode pads 28a, 28b are not covered with the protection layer 32, so that the electrode pads 28a, 28b are exposed from the protection layer 32. The protection layer 32 is made of non-magnetic material having electrically insulation property. Preferably, the protection layer 32 is made of, for example, silicon nitrides, aluminum nitrides, silicon oxides, phosphorized silicon oxides, and boron-doped silicon oxides. The protection layer 32 made of these materials prevents from oxidizing in a case where the magnetic layer 26 is made of easily oxidized material such as Ni and/or Fe, or prevents from crystallizing by heat treatment in a case where the magnetic layer 26 is made of amorphous alloy. Further, these materials are usually used in a general semiconductor process, so that the device 2 can be manufactured with using a general semiconductor process. Further, it is preferred that the protection layer 32 is formed of composite material having a plurality of insulation materials or has a laminated structure. In this case, by a combination of a plurality of insulation materials, the internal stress σ of the protection layer 32 can be reduced. Preferably, a thickness L11 of the protection layer 32 is in a range between 0.2 μm and 5 μm. In this case, the protection layer 32 can protect the magnetic layer 26 sufficiently. Further, the protection layer 32 is prevented from removing from the magnetic layer 26 caused by the internal stress σ of the protection layer 32. More preferably, the thickness of the protection layer 32 is in a range between 0.5 μm and 2 μm. In this case, the protection layer 32 protects the magnetic layer 26 much sufficiently. The above reasons are described later.

When the internal stress σ of the protection layer 32 is a compression stress, it is preferred that a magnitude of the compression stress is lower than 500 MPa. When the internal stress σ of the protection layer 32 is a tensile stress, it is preferred that the magnitude of the tensile stress is lower than 100 MPa. In this case, the sensor sensitivity of the device 2 is prevented from reducing caused by a deterioration of soft magnetic property of the magnetic layer 26 by the internal stress σ of the protection layer 32. Further, the protection layer 32 is prevented from removing from the magnetic layer 26 caused by the internal stress σ of the protection layer 32. When the internal stress σ of the protection layer 32 is a compression stress, more preferably the magnitude of the compression stress is lower than 200 MPa. When the internal stress σ of the protection layer 32 is a tensile stress, more preferably the magnitude of the tensile stress is lower than 50 MPa. Preferably, the protection layer 32 has an insulation resistance, which is equal to or larger than 10 MΩ. The above reasons are described later.

When the magnetic layer 26 is made of, for example, amorphous alloy, the amorphous alloy may be crystallized in a semiconductor process under high temperature higher than 400° C., so that the magnetic property is changed, i.e., the sensor sensitivity is reduced. Therefore, when the magnetic layer 26 is made of a certain material such as amorphous material, which is easily affected by temperature, it is preferred that the protection layer 32 is made of a material such as $SiO_2$, phospho-silicate glass (i.e., PSG), boro-silicate glass (i.e., BSG) and boro-phospho-silicate glass (i.e., BPSG), which has low heat conductivity.

When the magnetic layer 26 includes a material such as Ni and/or Co, which is easily oxidized, it is considered that the heat treatment under high temperature higher than 400° C. in a semiconductor process is performed in vacuum so that the magnetic layer 26 can be prevented from oxidizing. However, additional equipment to perform the heat treatment in vacuum is required, so that the manufacturing cost is increased. On the other hand, in a case where the protection layer 32 is disposed on the magnetic layer 26, the magnetic layer 26 is prevented from oxidizing even when the heat treatment is performed in the presence of oxygen, for example, in air. Thus, no additional equipment to perform the heat treatment in vacuum is necessitated. Further, comparing with increase of the manufacturing cost to prepare the additional equipment of the heat treatment in vacuum, manufacturing cost increase of an additional process to form the protection layer 32 is much lower. Moreover, the magnetic layer 26 is prevented from oxidizing by the protection layer 32 after being manufactured.

Next, the magnetic impedance device 2 according to the second embodiment is manufactured as follows. At first, as shown in FIGS. 4A to 4C, the substrate 22 is prepared. Then, the insulation layer 24 is formed on the substrate 22. When the substrate 22 is made of silicon, the surface of the silicon substrate 22 is oxidized with using thermal oxidation method so that the insulation layer 24 made of silicon oxides is formed. Further, the insulation layer 24 can be formed with using chemical vapor deposition method, sputtering method, or the like, and is made of silicon oxides, silicon nitrides. There is no limitation of the deposition method for forming the insulation layer 24.

Next, a ferromagnetic film having a soft magnetic property is formed on the insulation layer 24. The ferromagnetic film can be formed with using sputtering method, vapor deposition, or coating method. There is no limitation of the deposition method for forming the ferromagnetic film. The ferromagnetic film is patterned into a predetermined shape with using photo etching method, so that the magnetic layer 26 is formed, as shown in FIG. 4C. In this case, preferably the single axial anisotropic magnetic field is applied to the magnetic layer 26 in the energization direction of the alternating current, i.e., the longitudinal direction of the magnetic layer 26 with using deposition under magnetic filed or heat treatment under magnetic field, so that the magnetic layer 26 has the axis of easy magnetization.

Next, a preliminary layer for an electrode is formed on both the magnetic layer 26 and the insulation layer 24. The preliminary layer can be formed with using the sputtering method, vapor deposition, or coating method. There is no limitation of the deposition method for forming the preliminary layer. The preliminary layer is patterned into a predetermined shape with using photo etching method, so that the electrode pads 28a, 28b are formed so as to cover both ends of the magnetic layer 26, as shown in FIGS. 1 and 2.

Figure 20:
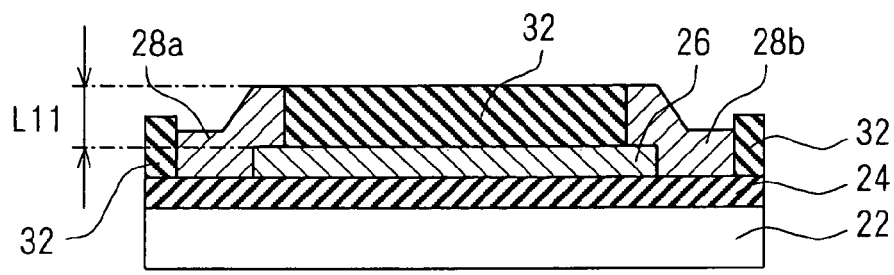
FIG. 20 is a cross-sectional view showing the device taken along line XX-XX in FIG. 19.

Next, an insulation material layer is formed on the insulation layer 24, the magnetic layer 26 and the electrode pads 28a, 28b. The insulation material layer can be formed with using the CVD method (that includes a plasma CVD method), the sputtering method and the like. There is no limitation of deposition method. This insulation material layer is patterned into a predetermined shape with using reactive ion etching method (i.e., RIE method) and the like, so that part of the insulation material layer disposed on the electrode pads 28a, 28b is removed. Thus, the protection layer 32 shown in FIGS. 19 and 20 is formed. Then, the electrodes 28a, 28b is connected with bonding wires. Thus, the magnetic impedance device 2 is completed.

Specifically, the detailed manufacturing method is described as follows. A magnetic impedance device S205 (that is shown in FIG. 21) according to this embodiment is manufactured. As shown in FIG. 4, the silicon substrate 22 is prepared. The insulation layer 24 made of silicon oxides having thickness of 1 µm is formed on the substrate 22 with using the thermal oxidation method.

Next, a $Ni_{81}Fe_{19}$ Alloy film having thickness of 2 µm is formed on the insulation layer 24 with using the sputtering method under magnetic field. The $Ni_{81}Fe_{19}$ Alloy film is patterned into a predetermined shape with using the photo etching method, so that the magnetic layer 26 is formed. Specifically, the magnetic layer 26 has a length of 2 mm and a width of 10 µm. At this time, the single axial anisotropic magnetic field is applied to the magnetic layer 26 in the energization direction of the alternating current, i.e., the longitudinal direction of the magnetic layer 26 with using the sputtering method under magnetic filed, so that the magnetic layer 26 has the axis of easy magnetization.

Next, aluminum layer having thickness of 1 µm is formed on both the insulation layer 24 and the magnetic layer 26. The aluminum layer is patterned into a predetermined shape with using the photo etching method so that the electrode pads 28a, 28b are formed so as to cover both ends of the magnetic layer 26, as shown in FIGS. 1 and 2. Specifically, the area of each electrode pad 28a, 28b disposed on the upper surface of the electrode pad 28a, 28b is a square of 200 µm×200 µm.

Next, a silicon nitride layer having thickness of 1 µm is formed on the insulation layer 24, the magnetic layer 26 and the electrode pads 28a, 28b with using the plasma CVD method. The silicon nitride layer is patterned into a predetermined shape with using the RIE method and the like so that part of the insulation material layer disposed on the electrode pads 28a, 28b is removed. Thus, the protection layer 32 is formed. On the assumption that the device S205 is processed in semiconductor process, the device S205 is processed in argon (i.e., Ar) gas atmosphere under 450° C. during 30 minutes. After that, each electrode pad 28a, 28b is connected with a bonding wire. Thus, the device S205 is completed.

The device S205 is evaluated with using a coil and an impedance analyzer. Here, the coil provides an external magnetic field Hext applied to the device S205, and the impedance analyzer detects a high frequency impedance Z generated at both ends of the magnetic layer 26 of the device S205. The external magnetic field Hext is parallel to the energization direction of the high frequency alternating current generated from the alternating current supply 30. The external magnetic field Hext is corrected with a gauss meter disposed on the substrate 22. The impedance Z is measured in case of the frequency of the high frequency current supply 30 at 100 MHz. The magnetic impedance property of the device S205 is evaluated with a ratio of impedance change $\Delta Z/Zo$. Here, Zo is impedance of the device S205 in a case where the external magnetic field Hext is zero. $\Delta Z$ is a difference between impedance Z in a case where the external magnetic field Hext is 100 Oe and the impedance Zo at zero, i.e., $\Delta Z = Z - Zo$. The above evaluation is performed before and after heat treatment under 450° C. so as to confirm a protection effect of the protection layer 32.

Figure 22:
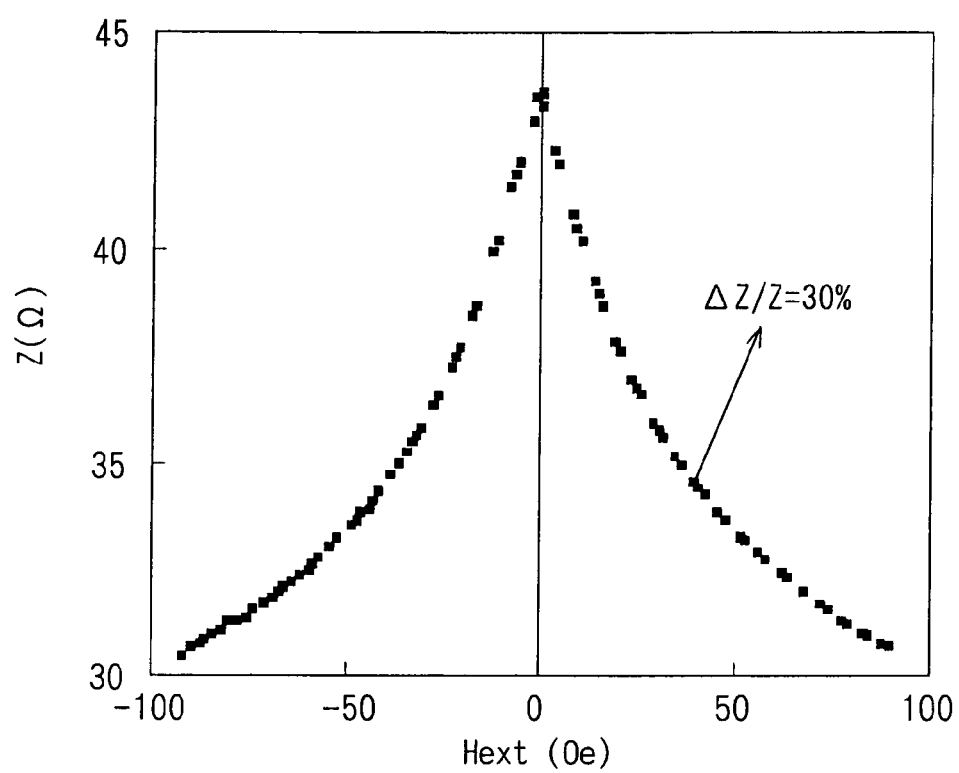
FIG. 22 is a graph showing a relationship between an external magnetic field Hext and impedance Z of the device according to the second embodiment.

FIG. 22 is a graph of magnetic impedance property of the device S205 showing an impedance change in accordance with the external magnetic field Hext before the heat treatment. In case of the device S205, the impedance of the device S205 is reduced in accordance with increasing or decreasing the external magnetic field Hext. As shown in FIG. 5, the ration of impedance change ΔZ/Zo, which corresponds to the sensor sensitivity, is about 30%.

Next, the device S205 is heated in Ar gas atmosphere under 450° C. during 30 minutes. Then, the device is evaluated with the above method. In this case, the magnetic impedance property of the device S205 has the same relationship between the external magnetic field and the magnetic impedance as that of the device S205 before heat treatment shown in FIG. 22. This result shows that the protection layer 32 made of silicon nitride covers the magnetic layer 26 made of Ni—Fe alloy film so that the Ni—Fe alloy film composing the magnetic layer 26 is not oxidized by the heat treatment. Therefore, the magnetic properties of the magnetic layer 26 do not change substantially. Further, as described later, although the protection layer 32 of the device S205 has a compression stress of −120 MPa, the internal stress σ of the compression stress does not affect the magnetic properties of the magnetic layer 26 substantially.

Both of ratios of impedance change ΔZ/Zo before and after heat treatment of various devices S201-S219 are measured. As shown in FIG. 21, devices S201-209 has the protection layer 32 made of silicon nitride and a different thickness of the protection layer 32 and/or a different internal stress σ, which are different from those of the device S205. Each device S210-S218 has the protection layer 32 made of different material and a different thickness of the protection layer 32 and/or a different internal stress σ, which are different from those of the device S205. A device S219 has no protection layer 32.

As shown in FIG. 21, in the devices S202-S209, S211-S218, the sensor sensitivity, i.e., the ratio of impedance change ΔZ/Zo does not change substantially before and after heat treatment. However, in the devices S201, S210, S219, the sensor sensitivity changes largely before and after heat treatment. Namely, the sensor sensitivity of the device S201, S210, S219 is much decreased after the heat treatment. That is because the device S219 has no protection layer 32, so that the soft magnetic property of the magnetic layer 26 disappears after the heat treatment since the Ni—Fe alloy film composing the magnetic layer 26 is oxidized by the heat treatment under 450° C. Although the device S201, S210 has the protection layer 32, the thickness of the protection layer 32 is 0.1 μm, which is so thin that the protection layer 32 can not protect the magnetic layer 26 made of Ni—Fe alloy film from oxidation.

Figure 23:
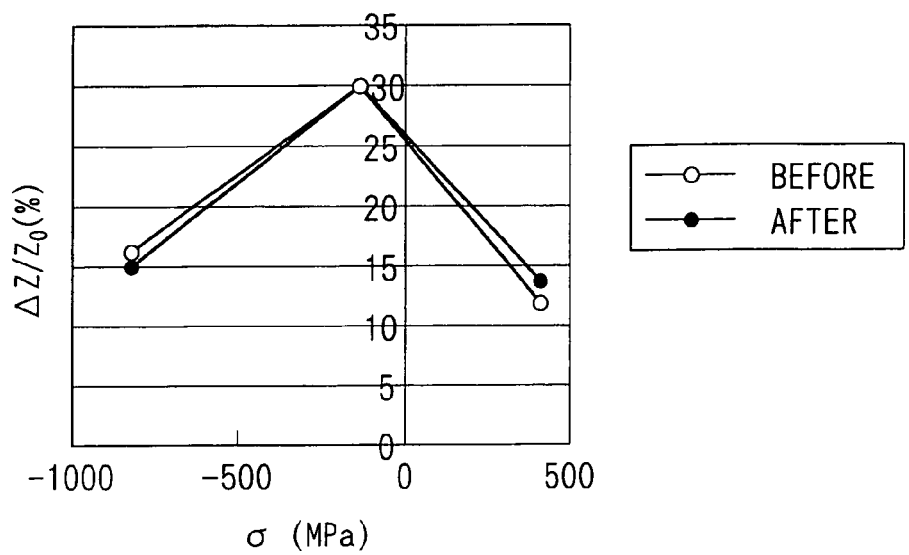
FIG. 23 is a graph showing a relationship between an internal stress σ of a protection layer and a ratio of impedance change ΔZ/Zo of the devices according to the second embodiment.

FIG. 23 shows the ratio of impedance change ΔZ/Zo of various devices S204-S206, each of which has the protection layer 32 made of silicon nitride. The thickness of the protection layer 32 of the device S204-S206 is 1 μm, and the internal stress σ of the protection layer 32 is different from each other. FIG. 23 also shows the ratio of impedance change ΔZ/Zo before and after heat treatment. Here, in a case where the internal stress σ is positive, the internal stress σ is the tensile stress. In a case where the internal stress σ is negative, the internal stress σ is the compression stress.

Figure 24:
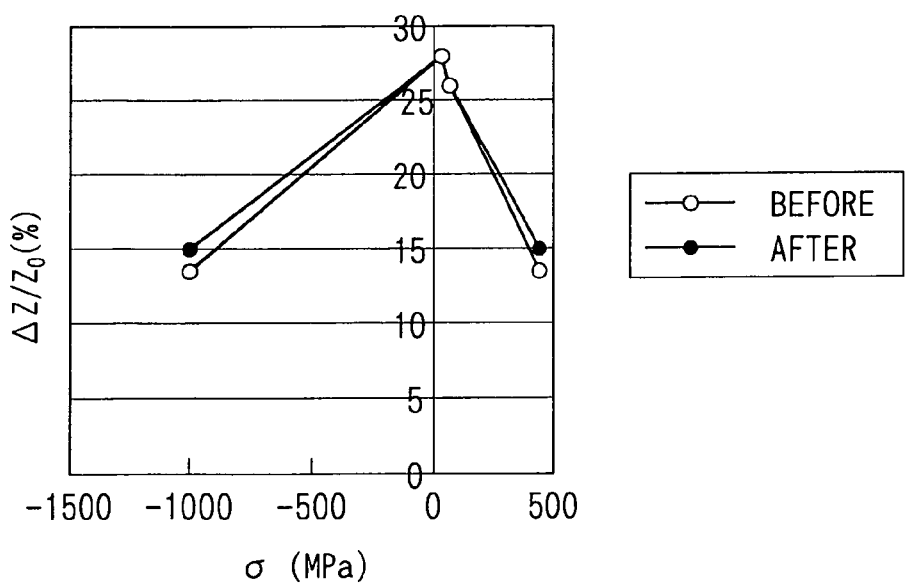
FIG. 24 is a graph showing a relationship between an internal stress σ of a protection layer and a ratio of impedance change ΔZ/Zo of the devices according to the second embodiment.

FIG. 24 shows the ratio of impedance change ΔZ/Zo of various devices S213-S216, each of which has the protection layer 32 made of silicon oxides. The thickness of the protection layer 32 of the device S213-S216 is 1 μm, and the internal stress σ of the protection layer 32 is different from each other. FIG. 24 also shows the ratio of impedance change ΔZ/Zo before and after heat treatment.

As shown in FIGS. 22 and 23, as the internal stress σ of the protection layer 32 becomes larger, the ratio of impedance change ΔZ/Zo is decreased. Namely, the sensor sensitivity is reduced. That is because a stress is generated in the magnetic layer 26 by the influence of the internal stress σ of the protection layer 32 when the internal stress σ of the protection layer 32 becomes large. Therefore, the magnetic properties of the magnetic layer 26 are changed, specifically, a coercive force of the magnetic layer 26 becomes large, so that the relative magnetic permeability of the magnetic layer 26 is reduced. Thus, the sensor sensitivity is reduced.

Further, there is a difference between one case where the internal stress σ of the protection layer 32 is the tensile stress and the other case where the internal stress σ is the compression stress. Specifically, even though the magnitude of the stress is the same, the ratio of impedance change is different between the tensile stress and the compression stress. More specifically, when the magnitude of the internal stress σ is the same, the reduction of the ratio of impedance change in case of the tensile stress is smaller than that in case of the compression stress.

As shown in FIGS. 23 and 24, in a case where the tensile stress is equal to or smaller than 100 MPa, the ratio of impedance change becomes larger than 20%. Preferably, in a case where the tensile stress is equal to or smaller than 50 MPa, the ratio of impedance change becomes larger than 25%. In a case where the compression stress is equal to or smaller than 500 MPa, the ratio of impedance change becomes larger than 20%. Preferably, in a case where the compression stress is equal to or smaller than 200 MPa, the ratio of impedance change becomes larger than 25%.

In the above devices having a certain construction of the protection layer 32, the sensor sensitivity is not decreased even when the device is processed with heat treatment. Thus, the device according to the second embodiment has high heat resistance. Specifically, the magnetic layer 26 of the device is not substantially oxidized even when the device is annealed. Further, the device has high sensor sensitivity.

Third Embodiment

Figure 25:
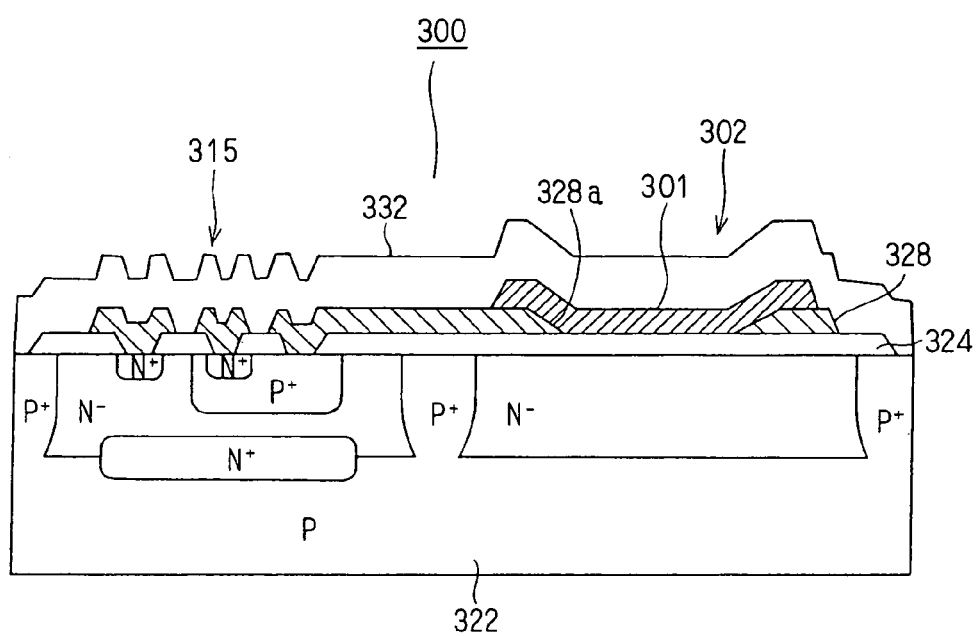
FIG. 25 is a cross-sectional view showing a magnetic sensor apparatus according to a third embodiment of the present invention.
Figure 26:
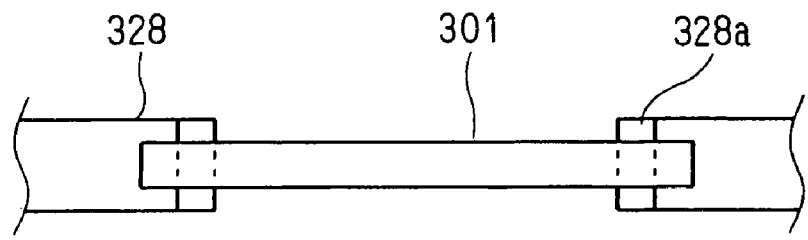
FIG. 26 is an enlarged plan view showing a magnetic impedance device of the apparatus according to the third embodiment.
Figure 27:
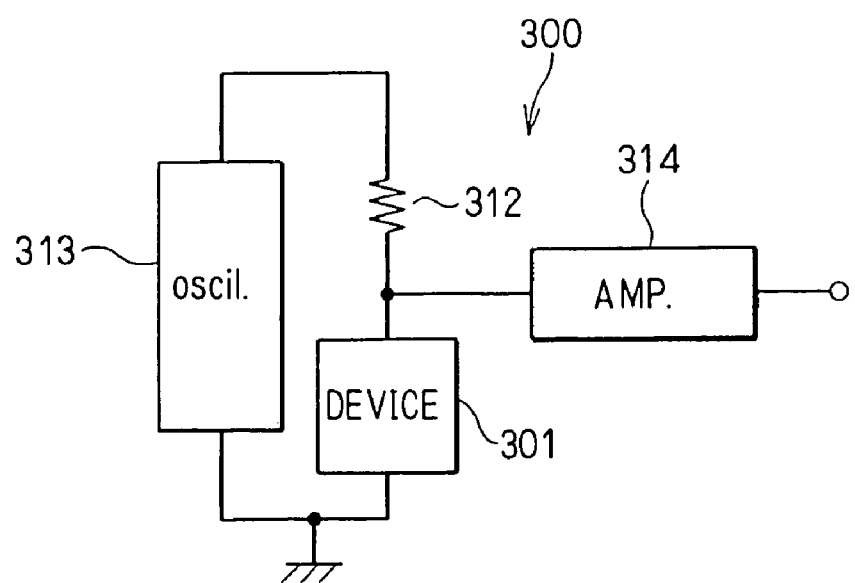
FIG. 27 is a schematic diagram showing an electric circuit of the apparatus according to the third embodiment.

A magnetic sensor apparatus 300 having a magnetic impedance device 301 according to a third embodiment of the present invention is shown in FIGS. 25-27. FIG. 27 shows a schematic diagram of the apparatus 300. The apparatus 300 includes the magnetic impedance device 301, a resistance 312, an oscillator 313, and an amplifier 314. Here, the resistance 312, the oscillator 313 and the amplifier 314 work as a periphery circuitry. The periphery circuitry may include a regulator circuit, and an interface circuit for communicating with a signal between the apparatus 300 and an external circuit. The device 301 is made of, for example, Ni—Fe series alloy, and connects to the resistance 312 in series. Here, the device 301 made of Ni—Fe series alloy has a wide dynamic range of detection of the magnetic field with using the magnetic impedance effect. Although the device 301 according to this embodiment is made of Ni—Fe alloy, the device 301 can be formed of other materials. The resistance 312 and the device 301 also connect to both ends of the oscillator 313 in series. The oscillator 313 works as a driving circuit for supplying a high frequency current to the device 301, and both ends of the oscillator 313 provide output terminals. The above series circuit composing the resistance 312, the device 301 and the oscillator 313 has a common contact point for connecting to an input terminal of the amplifier 314. The amplifier 314 amplifies a detection signal and outputs the amplified signal. Therefore, the amplifier 314 works as a detection circuit for detecting impedance change of the device 301.

FIG. 25 is a cross-section showing the apparatus 300. FIG. 26 is an enlarged plan view showing the device 301. The apparatus 300 is formed with using a semiconductor manufacturing method in bipolar process. However, the apparatus 300 can be formed with using another semiconductor process such as MOS process and BiCMOS process. The apparatus 300 includes a NPN type transistor 315 composing part of the amplifier 314, and a sensing portion 302 composing the magnetic impedance device 301.

The transistor 315 and the device 301 are disposed on a semiconductor substrate 322 made of P type silicon. Further, the resistance 312, the oscillator 313 and the amplifier 314 are disposed on the substrate 322 (not shown).

The bipolar process for forming the transistor 315 is a well-known process of the semiconductor manufacturing method. The transistor 315 is formed with using implant patterning method, implant diffusion method, separation patterning method, separation diffusion method, and the like, so that a base, an emitter and a collector the transistor 315 are formed with using patterning method, diffusion method and the like. Here, the semiconductor substrate 322 has an N type region disposed under the device 301. The N type region is formed with using the separation diffusion method.

Next, an insulation layer 324 made of silicon dioxide is formed on the substrate 322 and is patterned into a predetermined shape. Then, a wiring layer 328 made of aluminum and the like is formed on the substrate 322. The wiring layer 328 is patterned into a predetermined shape so that part of the wiring layer is etched and removed so as to form the device 301. At that time a top end 328a of the wiring layer 328 is patterned into a tapered shape. The top end 328a of the wiring layer 328 connects to the device 301.

Then, Ni—Fe alloy composing the device 301 is deposited on the substrate 322 with using sputtering method under magnetic field. The thickness of the Ni—Fe alloy deposited on the substrate 322 is in a range between 1 μm and 5 μm. Since the top end 328a of the wiring layer 328 is formed to be a tapered shape, the device 301, i.e., the Ni—Fe alloy film is limited from cutting caused by fault of step coverage.

Next, to improve the magnetic properties of the device 301, the apparatus 300 is annealed at about 300° C. in vacuum under magnetic field. At last, a protection layer 332 made of silicon nitride, silicon dioxide and the like is formed on the substrate 322.

Thus, the apparatus 300 having the device 301, the resistance 312, the oscillator 313, the amplifier 314, and other circuits are formed on the substrate 322. Therefore, the apparatus 300 is manufacture to be compact and minimized so that the manufacturing cost of the apparatus 300 becomes small. Further, the device 301 is formed of thin film so that the dimensions of the device 301, specifically thickness of the device 301, are smaller than that having an amorphous wire. Thus, the apparatus 300 is formed to be compact.

Further, since the top end 328a of the wiring layer 328 connecting to both ends of the device 301 is formed to be a tapered shape, the Ni—Fe alloy film composing the device 301 is limited from cutting at around the top end 328a of the wiring layer 328. That is because the step coverage of the Ni—Fe alloy film at the top end 328a is improved when the Ni—Fe alloy film is deposited on the wiring layer 328.

Thus, the sensor apparatus 300 having the magnetic impedance device 301 according to this embodiment has minimum size and is made with low manufacturing cost.

Fourth Embodiment

Figure 28:
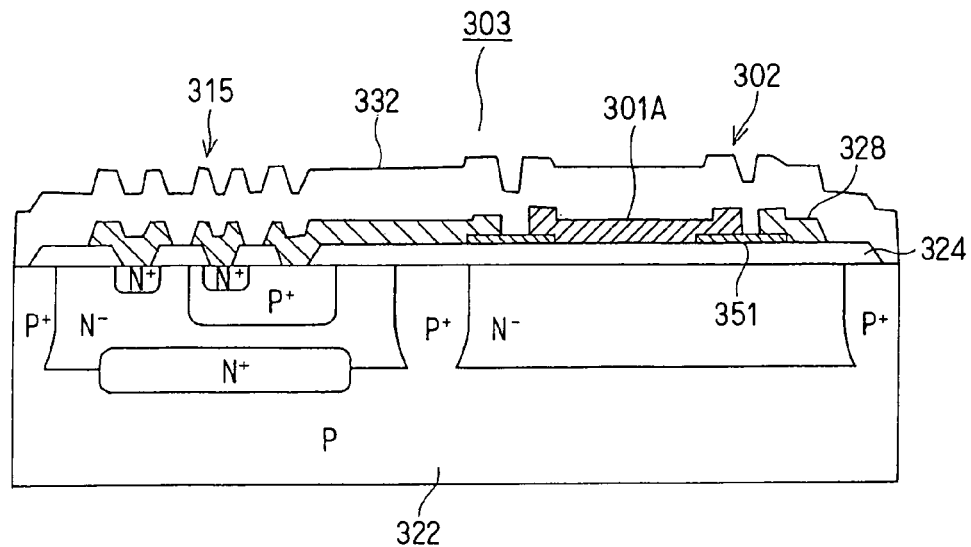
FIG. 28 is a cross-sectional view showing a magnetic sensor apparatus according to a fourth embodiment of the present invention.

A magnetic sensor apparatus 303 having a magnetic impedance device 301A according to a fourth embodiment of the present invention is shown in FIG. 28. Although the device 301A according to this embodiment is made of Ni—Fe alloy, the device 301A can be formed of other materials. The apparatus 303 includes a metallic film 351 made of titanium (i.e., Ti) material. The metallic film 351 is disposed on a connecting portion between the wiring layer 328 and a magnetic impedance device 301A. The metallic film 351 is formed on the substrate before the wiring layer 328 is formed. Thus, the metallic film 351 electrically connects the wiring layer 328 and the device 301A. Then, the protection layer 332 is formed on the substrate 322.

In the apparatus 303, since the metallic film 351 made of Ti material connects both ends of the device 301A and the top ends of the wiring layer 328, the connection between the device 301A and the wiring layer 328 becomes excellent ohmic contact.

Thus, the sensor apparatus 303 having the magnetic impedance device 301A according to this embodiment has minimum size and is made with low manufacturing cost. Further, the reliability of the connection is improved.

Fifth Embodiment

Figure 29:
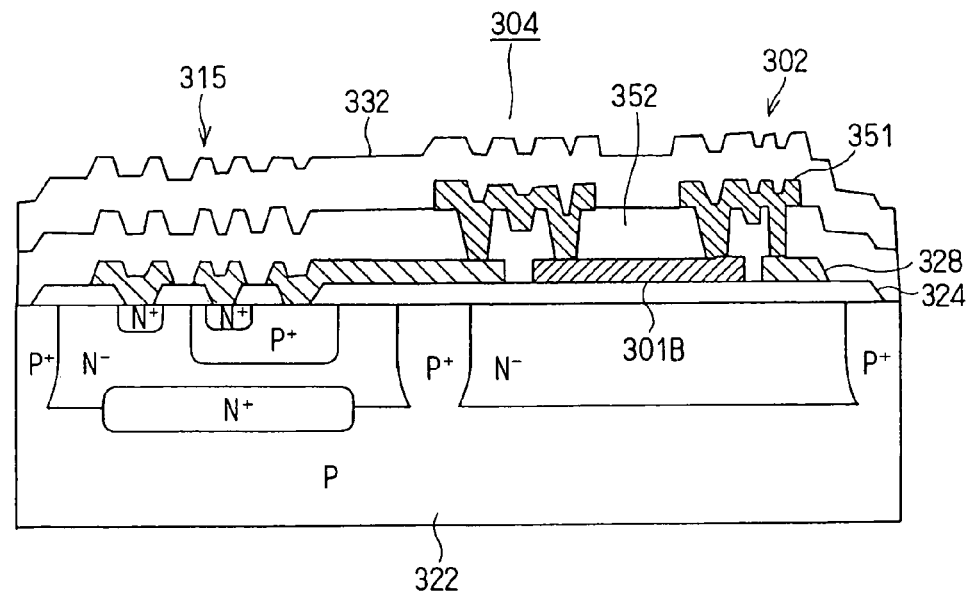
FIG. 29 is a cross-sectional view showing a magnetic sensor apparatus according to a fifth embodiment of the present invention.

A magnetic sensor apparatus 304 having a magnetic impedance device 301B according to a fifth embodiment is shown in FIG. 29. Although the device 301B according to this embodiment is made of Ni—Fe alloy, the device 301B can be formed of other materials. The apparatus 304 includes an interlayer insulation film 352 made of silicon oxides, silicon nitrides and the like. The interlayer insulation film 352 is formed on the substrate 322 after the device 301B and the wiring layer 328 are formed on the substrate 322. The interlayer insulation film 352 has a through hole for connecting the device 301B and the wiring layer 328. In the through hole, a metallic film 351 made of aluminum material, copper material, Al—Ti series alloy or the like is filled and deposited so that the metallic film 351 connects the wiring layer 328 and the device 301B. Then, the protection layer 332 is formed on the substrate 322.

In the apparatus 304, the interlayer insulation film 352 is formed on the upper surfaces of both the device 301B and the wiring layer 328, and the metallic film 351 connects both ends of the device 301B and the top ends of the wiring layer 328. Since the electrical connection is disposed on the upper surfaces, so that the connection between the device 301B and the wiring layer 328 becomes excellent ohmic contact.

Thus, the sensor apparatus 304 having the magnetic impedance device 301B according to this embodiment has minimum size and is made with low manufacturing cost. Further, the reliability of the connection is improved.

Sixth Embodiment

Figure 30:
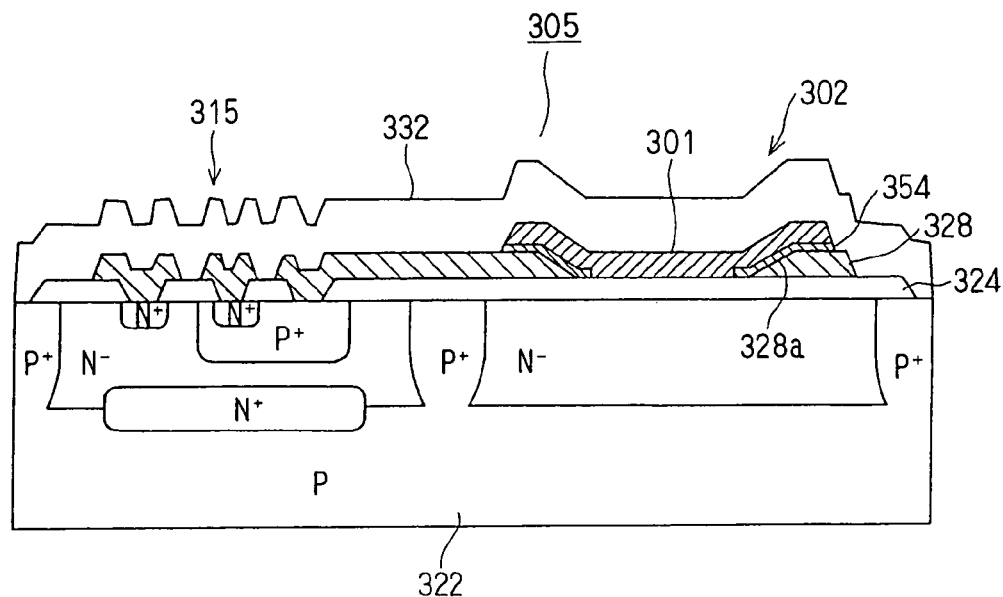
FIG. 30 is a cross-sectional view showing a magnetic sensor apparatus according to a sixth embodiment of the present invention.

A magnetic sensor apparatus 305 having the magnetic impedance device 301 according to a sixth embodiment is shown in FIG. 30. The apparatus 305 includes a barrier metal film 354 made of Ti material and the like. The barrier metal film 354 is formed on the top ends 328a of the wiring layer and its neighboring portion. Then, the device 301 and the protection layer 332 are formed on the substrate 322.

In the apparatus 305, since the barrier metal film 354 is disposed on the top ends 328a of the wiring layer and its neighboring portion, the connection portion between the device 301 and the wiring layer 328 has a tri-layer structure. Therefore, the tri-layer structure provides excellent ohmic contact between the device 301 and the wiring layer 328.

Thus, the sensor apparatus 305 having the magnetic impedance device 301 according to this embodiment has minimum size and is made with low manufacturing cost. Further, the reliability of the connection is improved.

Seventh Embodiment

Figure 31:
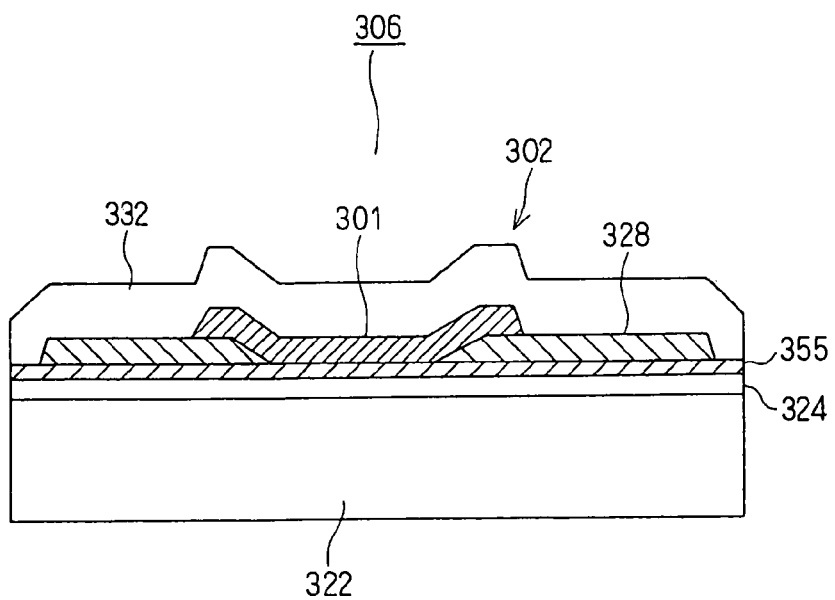
FIG. 31 is a cross-sectional view showing part of a magnetic sensor apparatus according to a seventh embodiment of the present invention.

A magnetic sensor apparatus 306 having the magnetic impedance device 301 according to a seventh embodiment is shown in FIG. 31. The apparatus 306 includes a stress relaxation layer 355 made of poly-imide. However, the stress relaxation layer 355 can be formed of other organic materials or inorganic materials with using thin film deposition techniques. The stress relaxation layer 355 is formed on the insulation layer 324 before the wiring layer 328 is formed. Namely, the insulation layer 324 is formed on the substrate 322, and the stress relaxation film 355 is formed on the surface of the insulation layer 324. After that, the wiring layer 328 is formed on the stress relaxation layer 355. The thickness of the stress relaxation layer is determined in accordance with the thickness of the device 301 disposed on the stress relaxation layer 355. For example, the thickness of the stress relaxation layer 355 is in a range between 1 µm and 10 µm.

Next, the Ni—Fe alloy film composing the device 301 is deposited with using the sputtering method so that the thickness of the Ni—Fe alloy film is in a range between 1 µm and 5 µm. Then, to improve the magnetic properties of the device 301, the apparatus 306 is annealed at about 300° C. in vacuum under magnetic field. At last, the protection layer 332 made of silicon nitride, silicon dioxide and the like is formed on the substrate 322.

When the apparatus 306 is annealed, a stress is generated in the substrate 322 since coefficient of thermal expansion of the substrate 322 is different from that of the device 301. Therefore, in some cases, the substrate 322 may be cracked.

Conventionally, to prevent from cracking, deposition condition for depositing a magnetic layer composing a magnetic impedance device is changed, or a film quality of the magnetic layer is changed. However, it is not considered about the crack in the substrate 322.

In the apparatus 306, the stress relaxation layer 355 is disposed between the substrate 322 and the device 301, so that the stress being applied to the substrate 322 is absorbed to the stress relaxation layer 355. Thus, the substrate 322 is limited from cracking. Further, since the stress relaxation layer 355 is made of poly-imide, which is an organic material, the stress relaxation layer 355 is easily formed.

Thus, the sensor apparatus 306 having the magnetic impedance device 301 according to this embodiment has minimum size and is made with low manufacturing cost. Further, the reliability of the apparatus concerned with a mechanical strength is improved.

Eighth Embodiment

Figure 32:
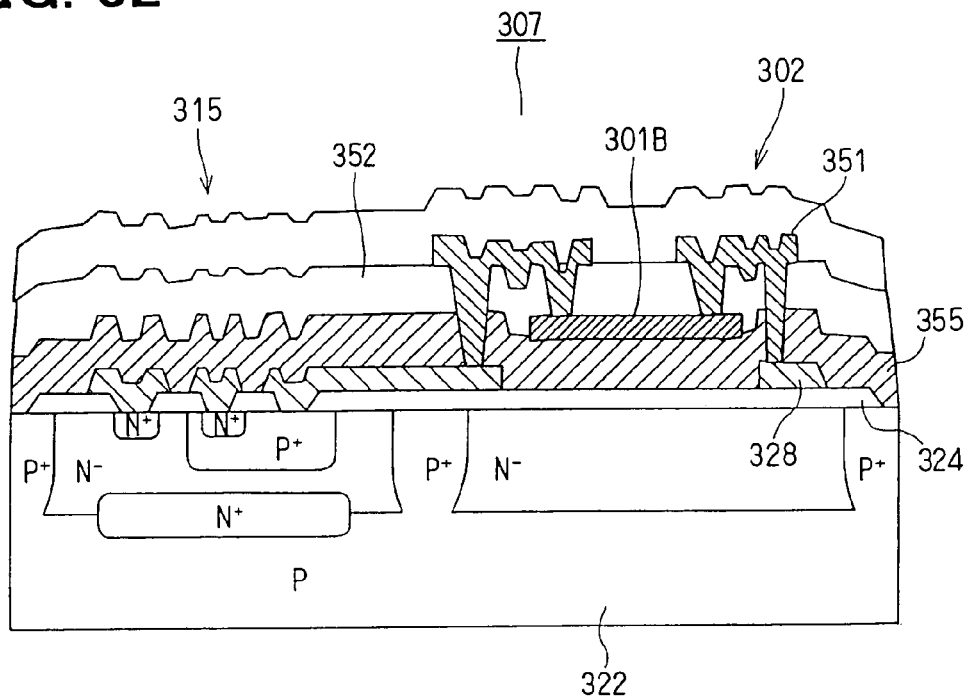
FIG. 32 is a cross-sectional view showing a magnetic sensor apparatus according to an eighth embodiment of the present invention.

A magnetic sensor apparatus 307 having the magnetic impedance device 301B according to an eighth embodiment is shown in FIG. 32. The apparatus 307 includes the stress relaxation layer 355. When the through hole for connecting the device 301B and the wiring layer 328 is formed in the interlayer insulation film 352, the through hole goes through the stress relaxation layer 355 disposed under the interlayer insulation film 352 so that the through hole reaches the wiring layer 328.

In the apparatus 307, the substrate 322 is limited from cracking. Further, the interlayer insulation film 352 is formed on the upper surfaces of both the device 301B and the wiring layer 328, and the metallic film 351 connects both ends of the device 301B and the top ends of the wiring layer 328. Since the electrical connection is disposed on the upper surfaces, so that the connection between the device 301B and the wiring layer 328 becomes excellent ohmic contact.

Thus, the sensor apparatus 307 having the magnetic impedance device 301B according to this embodiment has minimum size and is made with low manufacturing cost. Further, the reliability of the apparatus concerned with a mechanical strength is improved. Furthermore, the reliability of the connection is improved.

Ninth Embodiment

Figure 33:
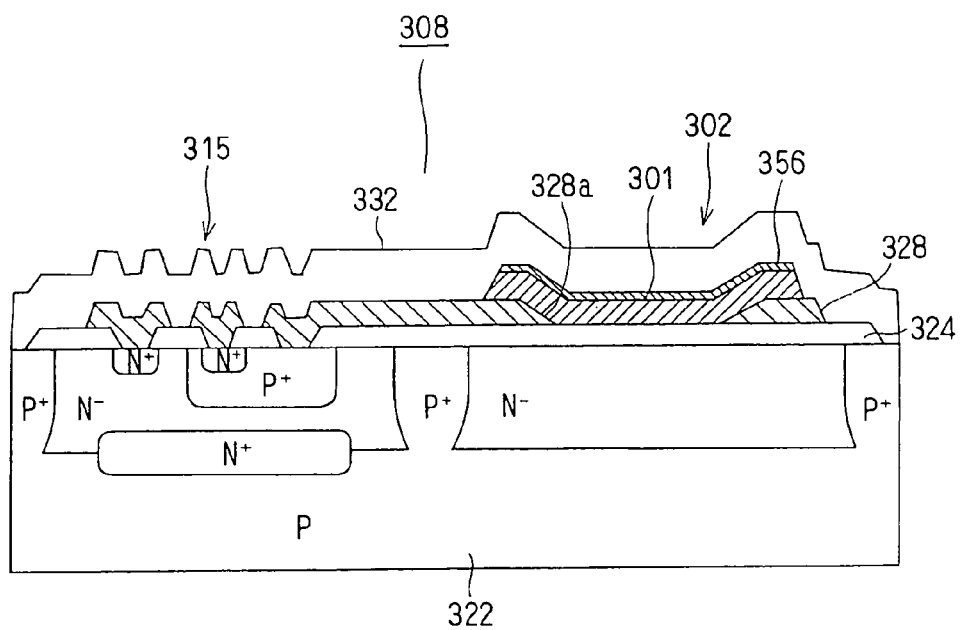
FIG. 33 is a cross-sectional view showing a magnetic sensor apparatus according to a ninth embodiment of the present invention.

A magnetic sensor apparatus 308 having the magnetic impedance device 301 according to a ninth embodiment is shown in FIG. 33. The apparatus 308 includes an oxidation protection film 356 made of silicon nitrides, silicon dioxide and the like. The oxidation protection film 356 is formed on the surface of the device 301.

Here, the magnetic properties of the device 301 depend on the surface of the device since the device 301 utilizes the skin effect of magnetic thin film. Therefore, if the surface of the device 301 is oxidized, the magnetic detection of the device 301 is reduced.

Therefore, the oxidation protection film 356 protects the surface of the device 301 so as not to be oxidized. Thus, the magnetic properties of the device 301 can be maintained to be excellent.

Thus, the sensor apparatus 308 having the magnetic impedance device 301 according to this embodiment has minimum size and is made with low manufacturing cost. Further, the apparatus 308 has high heat resistance.

The oxidation protection film 356 can be formed on the device 300, 301A, 301B of the apparatus 303-307 shown in FIGS. 28-32.

Tenth Embodiment

Figure 34:
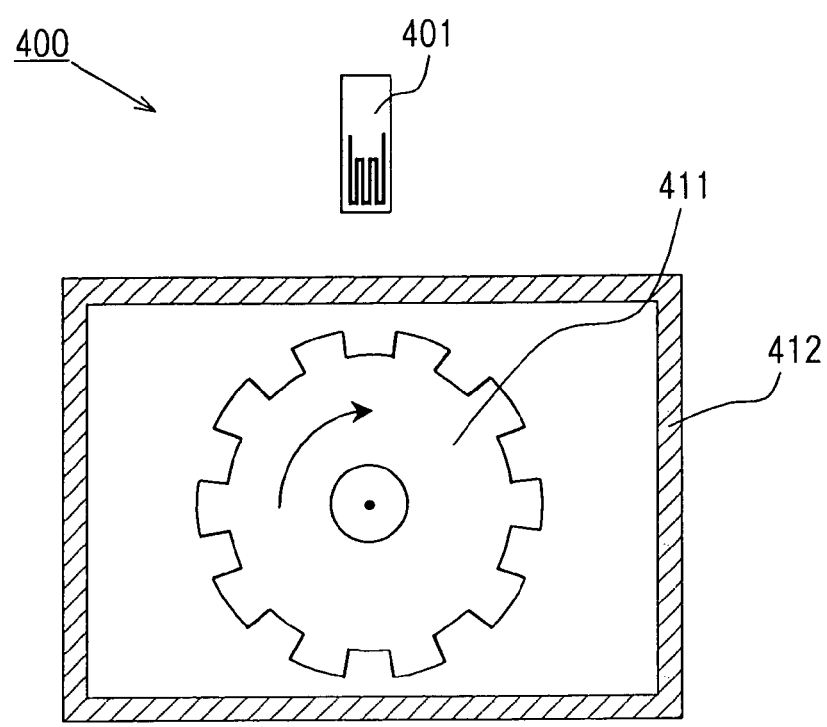
FIG. 34 is a schematic cross-sectional view showing a rotation sensor apparatus according to a tenth embodiment of the present invention.

A rotation sensor apparatus 400 having a magnetic sensor 401 according to a tenth embodiment of the present invention is shown in FIG. 34. The rotation sensor apparatus 400 includes a rotation body 411 as an object to be detected its rotation, a casing 412 for covering the rotation body 411, and the magnetic sensor 401. The casing 412 separates between the rotation body 411 and the magnetic sensor 401. The magnetic sensor 401 is provided by, for example, the magnetic sensor apparatus 25 shown in FIG. 25. Therefore, the magnetic sensor 401 includes a magnetic impedance sensor.

The rotation body 411 is made of a magnetic material or a material including the magnetic material, and is a gear having a gearwheel shape. When the rotation body 411 rotates, a magnetic field around the rotation body 411 changes repeatedly.

Figure 35A:
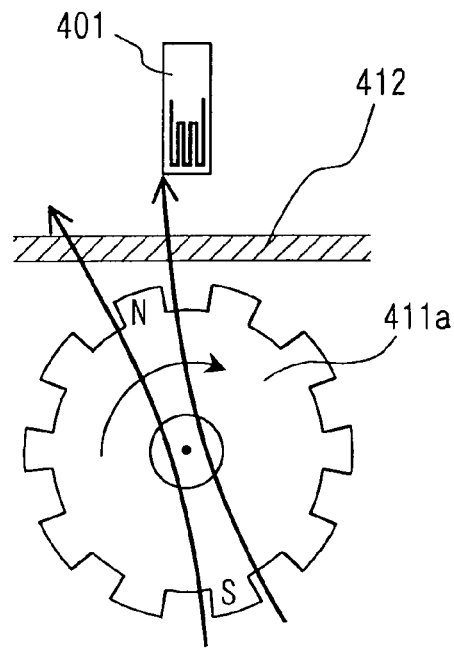
FIGS. 35A to 35C are schematic cross-sectional views showing part of the rotation sensor apparatus according to the tenth embodiment.

In a case where the rotation body 411 is made of magnetic material, the rotation body 411 is magnetized by a surrounding magnetic field. Therefore, the rotation body 411 works as a magnetized gear 411a, as shown in FIG. 35A. The magnetized gear 411a attracts a permanent magnet. In FIG. 35A, a pair of arrows shows magnetic field lines generated by the magnetized gear 411a. When the magnetized gear 411a rotates, the magnetic field lines also rotate so that the intensity of magnetic field around the magnetized gear 411a changes periodically.

Figure 35B:
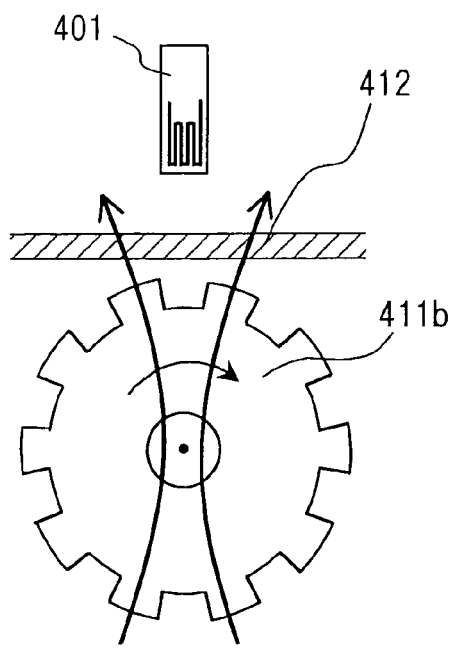
Figure 35C:
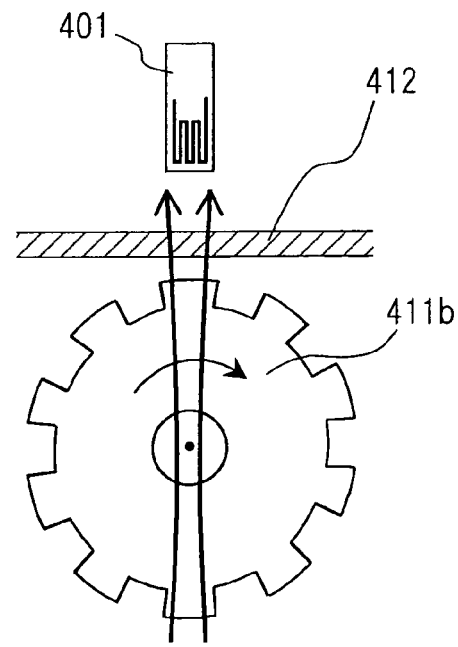

In a case where the rotation body 411 is not magnetized, the rotation body works as a non-magnetized gear 411b. Even though the non-magnetized gear 411b is not magnetized, the intensity of magnetic field around the non-magnetized gear 411b changes periodically. That is because the magnetic field lines of the geomagnetic filed changes periodically by alternating appearance of a concavity and convexity of periphery of the gear 411b when the non-magnetized gear 411b rotates. As shown in FIGS. 35B and 35C, when the concavity of the gear 411b faces the magnetic sensor 401, the intensity of magnetic field around the magnetic sensor 401 becomes weak. When the convexity of the gear 411b faces the magnetic sensor 401, the intensity of magnetic field around the magnetic sensor 401 becomes strong. Thus, the intensity of magnetic field around the gear 411b changes periodically.

Thus, the magnetic sensor 401 detects the periodic change of the intensity of magnetic field when the rotation body 411 rotates. Therefore, the rotation of the rotation body 411 can be detected by the magnetic sensor 401.

The magnetic sensor 401 is, for example, a magnetic sensor apparatus having a magnetic impedance device. The magnetic sensor apparatus includes a Ni—Fe series alloy film formed on a non-magnetic substrate. As shown in FIG. 35, the Ni—Fe series alloy film of the magnetic sensor 401 has a predetermined pattern in such a manner that a plurality of linear shaped films is arranged at predetermined intervals parallel to a magnetic field detection direction, and is repeatedly connected together so that they forms a switchback shape.

A high frequency alternating current is applied to both ends of the Ni—Fe series alloy film of the magnetic sensor 401, so that the impedance between both ends is changed in accordance with the change of the external magnetic field. The impedance change is measured by an electric circuit (not shown), and then the impedance change is converted to an electric signal. The electric signal is outputted from the magnetic sensor 401. Thus, the signal, which corresponds to the rotation of the rotation body 411, is obtained.

The magnetic sensor 401 having the magnetic impedance device has high sensor sensitivity, which is much higher than that of a conventional magneto-resistance sensor or hall element sensor. Accordingly, even when the magnetic sensor 401 is disposed outside the casing 412, the magnetic sensor 401 can detect the change of magnetic field generated by the rotation of the rotation body 411 disposed in the casing 412 so that the magnetic sensor 401 detects the rotation of the rotation body 411. Specifically, the magnetic sensor 401 detects the periodic change of the intensity of magnetic field, which is generated by the rotation of the rotation body 411 and leaks outside the casing 412. Then, the magnetic sensor 401 converts the signal to the electric signal. Here, the magnetic sensor 401 includes a driving circuit, a sensing portion, a detection circuit, a regulator, and an input-output circuit (not shown).

The casing 412 works as a separation shield for separating between the rotation body 411 and the magnetic sensor 401. The casing 412 is made of aluminum. However, the casing 412 can be made of other non-magnetic materials such as copper and brass. Further, the casing 412 can be made of non-metallic non-magnetic materials such as resin and ceramics. When the casing is made of non-magnetic material, which does not attract a permanent magnet, the periodic change of the intensity of magnetic field generated by the rotation of the rotation body 411 is not substantially disturbed by the casing 412. Therefore, even when the magnetic sensor 401 is disposed outside the casing 412, the magnetic sensor 401 can detect the rotation of the rotation body 411 accurately.

Here, since the magnetic sensor 401 has high sensor sensitivity, the rotation sensor apparatus 400 has no bias magnet for applying an additional magnetic field as a bias magnetic field.

Figure 36:
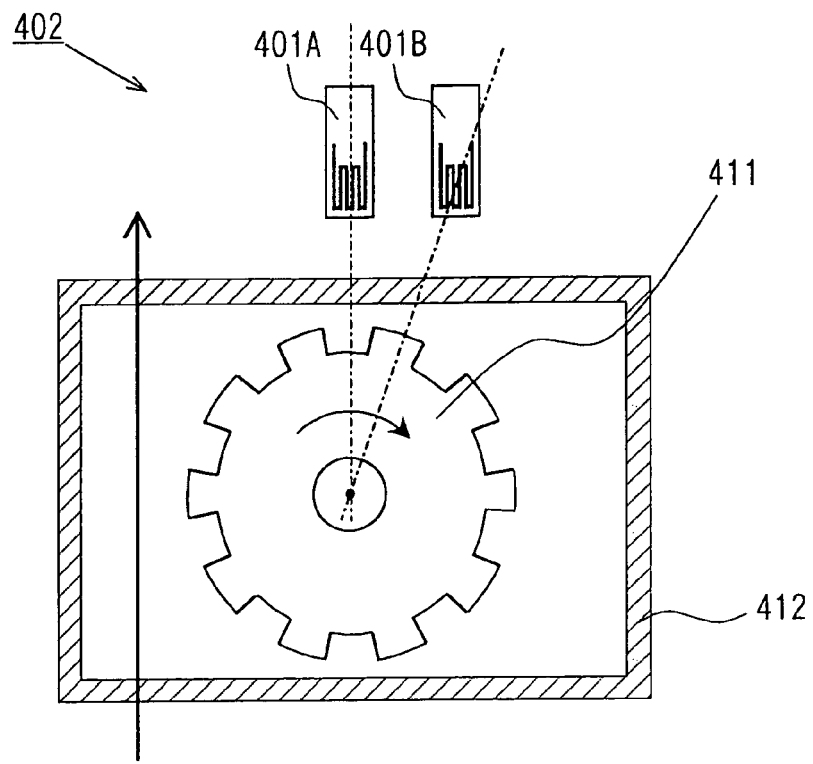
FIG. 36 is a schematic cross-sectional view showing another rotation sensor apparatus according to the tenth embodiment.

FIG. 36 shows a rotation sensor apparatus 402 having a pair of magnetic sensors 401A, 401B. In the apparatus 402, two magnetic sensors 401A, 401b are arranged in parallel so as to separate by a half of pitch of the rotation body 411, i.e., by a half pitch of gear. The apparatus 402 detects a differential output generated from both magnetic sensors 401A, 401B. This differential output cancels a constant component of the geomagnetic field disposed in each magnetic sensor 401A, 401B. Therefore, the apparatus 402 detects the periodic change of magnetic field much accurately. Namely, the apparatus 402 detects the rotation much accurately.

In each apparatus 400, 402, the magnetic sensor 401, 401A, 401B having high sensor sensitivity can detect the rotation of the rotation body 411, 411a, 411b, even though the casing 412 as a separation shield is disposed between the magnetic sensor 401, 401A, 401B and the rotation body 411, 411a, 411b. Therefore, the magnetic sensor 401, 401A, 401B can be disposed outside the casing 412 without drilling an opening for mounting the magnetic sensor 401, 401A, 401B. Thus, the apparatus 400, 402 has high mounting performance for mounting the magnetic sensor 401, 401A, 401B on the casing 412 and high design freedom of the casing 412.

The apparatus 400, 402 is suitably used for detecting a rotation of a cam of camshaft in an engine of an automotive vehicle or a gear of a crankshaft in an engine of a vehicle. The apparatus 400, 402 can detect the rotation without opening a hole for detecting the rotation, i.e., without drilling in a wall of engine casing (e.g., an engine block) of the vehicle. Accordingly, the apparatus 400, 402 has high mounting performance on the engine of the vehicle, so that design freedom for mounting the apparatus on the engine, on which a lot of parts are mounted, is improved.

Further, the apparatus 400, 402 can detect a rotation of a wheel of an automotive vehicle. For example, the magnetic sensor 401, 401A, 401B detects the periodic change of the intensity of magnetic field in accordance with the rotation of the wheel. Then, the apparatus 400, 402 outputs the electric signal so that the apparatus 400, 402 detects the rotation of the wheel. Here, the magnetic sensor 401, 401A, 401B is mounted on an engine hood of the vehicle or in a compartment of the vehicle.

Eleventh Embodiment

Figure 37:
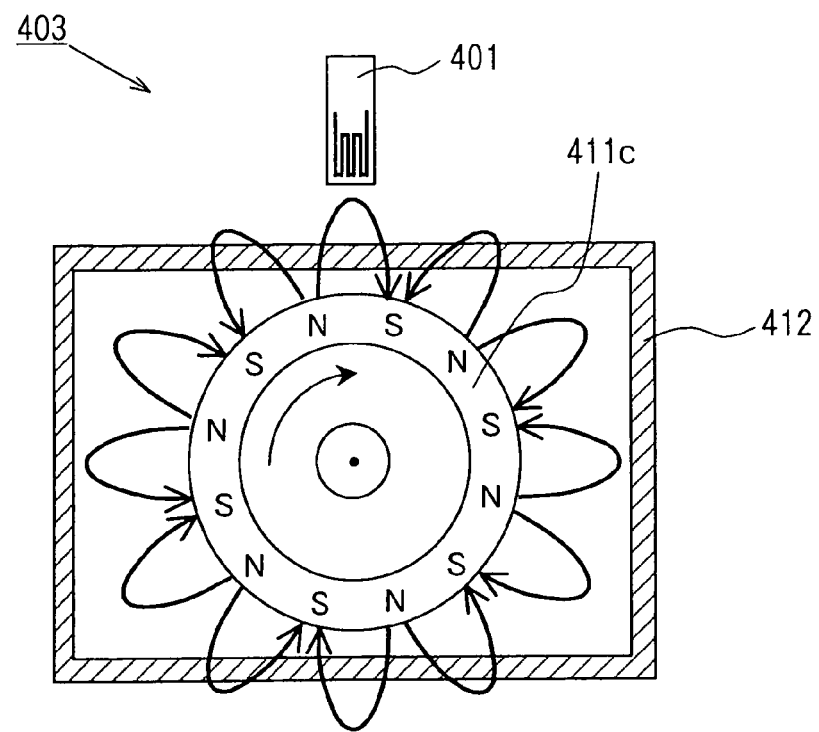
FIG. 37 is a schematic cross-sectional view showing a rotation sensor apparatus according to an eleventh embodiment of the present invention.

A rotation sensor apparatus 403 having the magnetic sensor 401 according to an eleventh embodiment of the present invention is shown in FIG. 37. The rotation sensor apparatus 403 includes a rotation body 411c, the casing 412 and the magnetic sensor 401. The rotation body 411c includes a cylindrical magnet. Each of N and S poles of the cylindrical magnet is alternately disposed on a circumferential periphery of the cylindrical magnet.

As shown in FIG. 37, a center axis of the cylindrical magnet works as a rotation axis, so that the rotation body 411c works as a magnetic rotor having a pair of magnet poles disposed alternately on the circumferential periphery of the rotor. Magnetic field lines generated by the rotation body 411c output from the rotation body 411c, and are disposed periodically. When the rotation body 411c rotates, a periodic change of the intensity of magnetic field is generated around the rotation body 411c. This periodic change is detected by the magnetic sensor 401 disposed outside the casing 412, so that the apparatus 403 can detect the rotation of the rotation body 411c.

Although the apparatus 403 has a single magnetic sensor 401, the apparatus can have a pair of magnetic sensors. In this case, two magnetic sensors are arranged in parallel to separate by a half of pitch of the rotation body 411c. The apparatus detects a differential output generated from both magnetic sensors. This differential output cancels a constant component of the geomagnetic field disposed in each magnetic sensor. Therefore, the apparatus detects the rotation much accurately. Specifically, in a case where the intensity of magnetization of the rotation body 411c is weak so that the periodic change of the intensity of magnetic field in accordance with the rotation of the rotation body 411c is small, the apparatus 403 having a pair of magnetic sensors can effectively detect the rotation.

In the apparatus 403, the magnetic sensor 401 having high sensor sensitivity can detect the rotation of the rotation body 411c, even though the casing 412 as a separation shield is disposed between the magnetic sensor 401 and the rotation body 411c. Therefore, the magnetic sensor 401 can be disposed outside the casing 412 without drilling an opening for mounting the magnetic sensor 401. Thus, the apparatus 403 has high mounting performance for mounting the magnetic sensor 401 on the casing 412 and high design freedom of the casing 412.

The apparatus 403 is suitably used for detecting a rotation of a magnetized rotor mounted on a rotation shaft of a wheel of an automotive vehicle. In this case, the apparatus 403 provides a wheel rotation sensor for anti lock break system (i.e., ABS) of the vehicle. In the ABS, the magnetic sensor 401 is mounted on a wheel hub as a rotor casing without drilling a hole in the rotor casing. Accordingly, the apparatus 403 can mount on the wheel hub, which is required to have a narrow mounting portion since the wheel and a suspension are nearly disposed. Thus, the apparatus 403 has high mounting performance to the wheel hub, so that design freedom for mounting the apparatus 403 on the wheel hub is improved.

Further, the apparatus 403 can detect a rotation of a wheel of an automotive vehicle. In this case, the magnetic sensor 401 is mounted on an engine hood of the vehicle or in a compartment of the vehicle.

Twelfth Embodiment

Figure 38A:
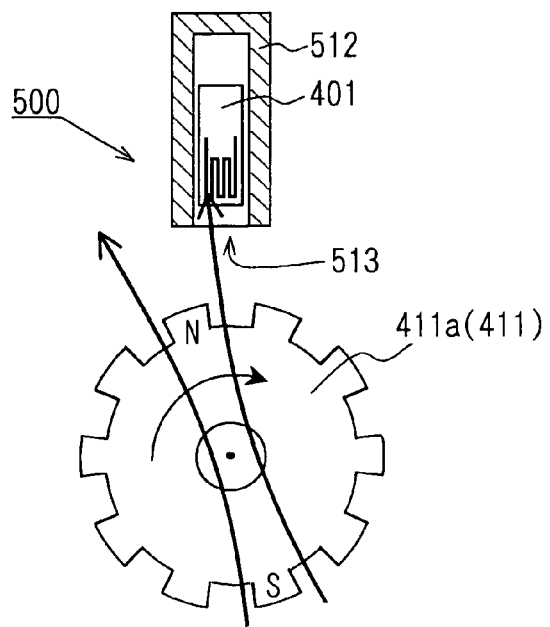
FIGS. 38A to 38C are schematic cross-sectional views showing a rotation sensor apparatus according to a twelfth embodiment of the present invention.
Figure 38B:
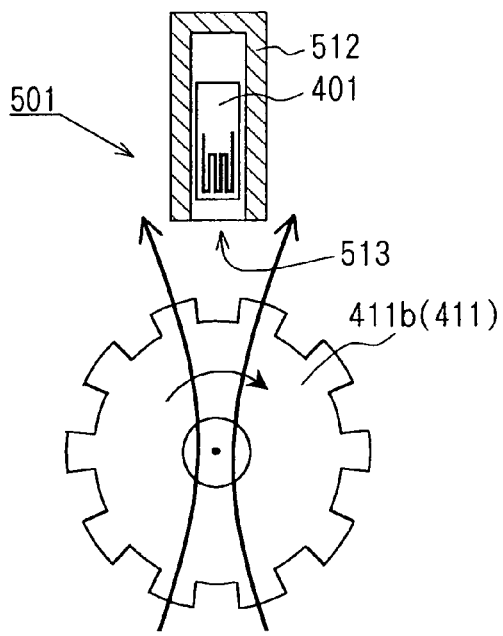
Figure 38C:
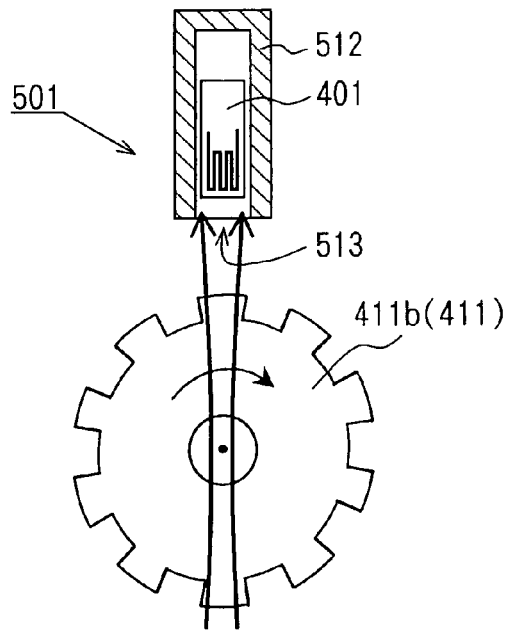

Rotation sensor apparatuses 500, 501 having the magnetic sensor 401 according to a twelfth embodiment of the present invention are shown in FIGS. 38A to 38C. Each rotation sensor apparatus 500, 501 includes the magnetized gear 411a or the non-magnetized gear 411b as a rotation body 411 as an object to be detected its rotation, the magnetic sensor 401, a sensor casing 512 for covering the magnetic sensor 401. The sensor casing 512 separates between the rotation body 411 and the magnetic sensor 401.

The sensor casing 512 covers the magnetic sensor 401, and is made of magnetic material. The sensor casing 512 includes an opening 513 disposed between the magnetic sensor 401 and the rotation body 411. Namely, the opening 513 faces the rotation body 411. In the apparatus 500, 501, the magnetic sensor 401 having high sensor sensitivity is surrounded by the sensor casing 512 having high magnetic permeability. Accordingly, the sensor casing 512 partially shields a magnetic field so that influence of disturbance of an external magnetic field around the magnetic sensor 401 is reduced. Namely, the apparatus 500, 501 has high resistance against the outside disturbance of magnetic field.

The periodic change of the intensity of magnetic field generated by the rotation of the rotation body 411 is detected by the magnetic sensor 401 through the opening 513 of the sensor casing 512. Thus, the magnetic sensor 401 can detect the rotation of the rotation body 411. Here, since the magnetic sensor 401 has high sensor sensitivity for detecting magnetic field, the opening 513 of the sensor casing 512 can be minimized as long as the magnetic sensor 401 detects the periodic change of the intensity of magnetic field.

Thus, the apparatus 500, 501 has a simple construction in such a manner that the sensor casing 512 having a small opening 513 covers the magnetic sensor 401 so that the influence of disturbance of an external magnetic field around the magnetic sensor 401 is reduced. Therefore, the manufacturing cost of the apparatus 500, 501 is reduced.

The apparatus 500, 501 is suitably used for detecting a rotation of a cam of camshaft in an engine of an automotive vehicle or a gear of a crankshaft in an engine of a vehicle. Here, there are many sources to generate disturbance of the external magnetic field around the engine of the vehicle. Further, the disturbance of the external magnetic field has a complicated structure. Even when the apparatus 500, 501 is disposed in such a complicated disturbance, the influence of disturbance is reduced so that the apparatus 500, 501 detects the rotation accurately.

Figure 39:
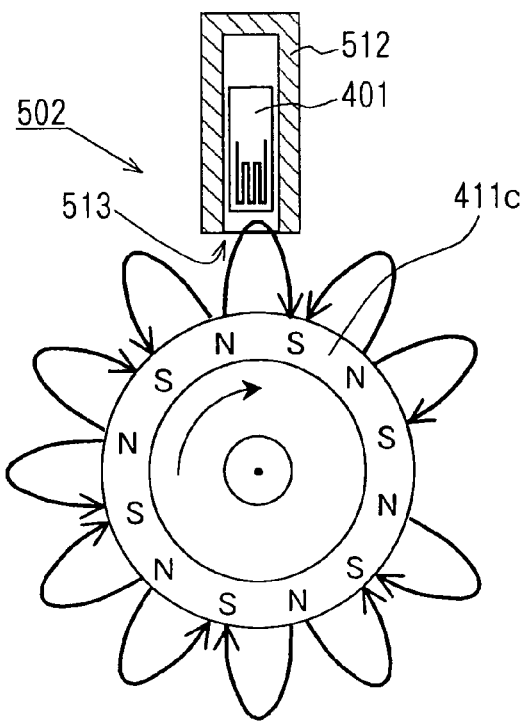
FIG. 39 is a schematic cross-sectional view showing another rotation sensor apparatus according to the twelfth embodiment.

Although the rotation body 411 has a gearwheel shape and is made of a magnetic material or a material including the magnetic material, the rotation body 411 can have another shape and be made of another material. As shown in FIG. 39, a rotation sensor apparatus 502 has the rotation body 411c. The rotation body 411c includes a cylindrical magnet. Each of N and S poles of the cylindrical magnet is alternately disposed on a circumferential periphery of the cylindrical magnet. The apparatus 502 further includes the magnetic sensor 401 and the sensor casing 512 having the opening 513. In the apparatus 502, the sensor casing 512 partially shields a magnetic field so that influence of disturbance of an external magnetic field around the magnetic sensor 401 is reduced. Further, the magnetic sensor 401 detects the periodic change of the intensity of magnetic field generated by the rotation of the rotation body 411c through the opening 513 of the sensor casing 512. Thus, the magnetic sensor 401 can detect the rotation of the rotation body 411c.

Thus, the apparatus 502 has a simple construction in such a manner that the sensor casing 512 having the small opening 513 covers the magnetic sensor 401 so that the influence of disturbance of an external magnetic field around the magnetic sensor 401 is reduced. Therefore, the manufacturing cost of the apparatus 502 is reduced.

The apparatus 502 is suitably used for detecting a rotation of a magnetized rotor mounted on a rotation shaft of a wheel of an automotive vehicle. In this case, the apparatus 502 provides a wheel rotation sensor for ABS of the vehicle. Here, there are many sources to generate disturbance of the external magnetic field under a body of the vehicle. Further, the disturbance of the external magnetic field has a complicated structure. Even when the apparatus 502 is disposed in such a complicated disturbance, the influence of disturbance is reduced so that the apparatus 502 detects the rotation accurately.

Thirteenth Embodiment

Figure 40A:
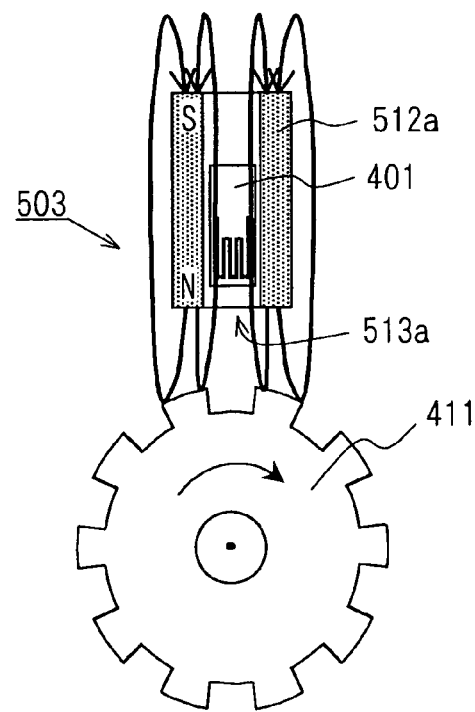
FIGS. 40A and 40B are schematic cross-sectional views showing a rotation sensor apparatus according to a thirteenth embodiment of the present invention.
Figure 40B:
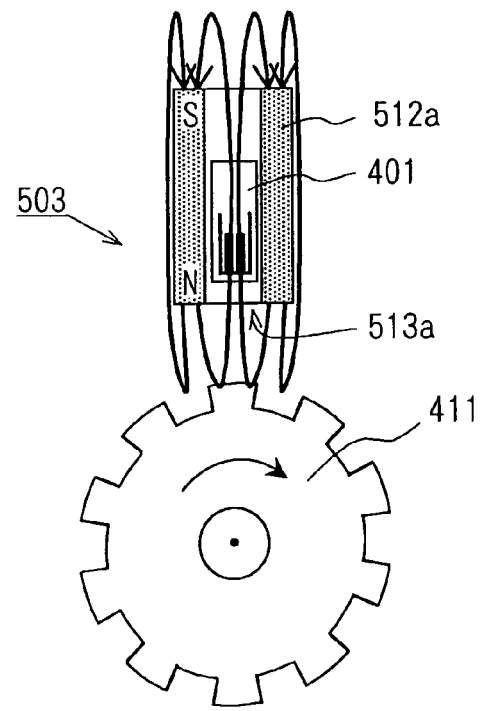

A rotation sensor apparatus 503 having the magnetic sensor 401 according to a thirteenth embodiment of the present invention is shown in FIGS. 40A and 40B. The rotation sensor apparatus 503 includes the rotation body 411 made of a magnetic material or a material including the magnetic material, the magnetic sensor 401, and a sensor casing 512*a* for covering the magnetic sensor 401. The sensor casing 512*a* is made of permanent magnet. Both ends of the sensor casing 512*a* are opened, and the sensor casing 512*a* has a cylindrical shape. One end of the sensor casing 512*a* has an opening 513*a*, which faces the rotation body 411. The sidewall of the sensor casing 512*a* is formed of the permanent magnet. In the sensor casing 512*a*, the magnetic sensor 401 is disposed. Specifically, the magnetic sensor 401 is disposed on the rotation body side, and does not protrude from the opening 513*a* of the sensor casing 512*a*.

In the apparatus 503, the magnetic sensor 401 having high sensor sensitivity is surrounded by the sensor casing 512*a* made of the permanent magnet. The external magnetic field is prevented from inserting into the sensor casing 512*a* except for the opening 513*a* because the sensor casing 512*a* is made of the permanent magnet. Thus, the sensor casing 512*a* works as a magnetic shield for shielding the disturbance of the external magnetic field.

Further, the sensor casing 512*a* works as not only a magnetic shield but also a bias magnet for applying a bias magnetic field shown as arrows in FIGS. 40A and 40B. The one end of the sensor casing 512*a*, at which the opening 513*a* is disposed, provides one pole, and the other end provides the other pole. Therefore, the maximum bias magnetic field is applied toward the rotation body 411. Part of the bias magnetic field penetrates into a cavity of the sensor casing 512*a*, so that part of the bias magnetic field reaches the magnetic sensor 401. When the rotation body 411 rotates, the concavity and convexity disposed on a circumferential periphery of the rotation body 411 changes the magnetic field lines of the bias magnetic field periodically. Therefore, the periodic change of the intensity of magnetic field in accordance with the rotation of the rotation body 411 affects the bias magnetic field penetrated in the cavity of the sensor casing 512*a*. Thus, the magnetic sensor 401 detects this periodic change of the intensity of magnetic field, so that the apparatus 503 detects the rotation of the rotation body 411.

The periodic change of the intensity of magnetic field in accordance with the rotation of the rotation body 411 can be enlarged by controlling the bias magnetic field of the permanent magnet composing the sensor casing 512*a*, even in a case where the rotation body 411 is not magnetized so that no magnetic field is generated by the rotation body 411. Therefore, the magnetic sensor 401 can detect the rotation accurately.

With using the rotation sensor apparatus 503 having the sensor casing 512*a* made of the permanent magnet, detection accuracy for detecting the rotation is improved. Here, when the opening 513*a* becomes small, the bias magnetic field is difficult to penetrate into the cavity of the sensor casing 512*a*. However, the magnetic sensor 401 with the magnetic impedance device has high sensor sensitivity for detecting the magnetic field, so that the opening 513*a* of the sensor casing 512*a* can be minimized as long as the magnetic sensor 401 detects the periodic change of the intensity of magnetic field.

Thus, the apparatus 503 has a simple construction in such a manner that the sensor casing 512*a* having the small opening 513*a* covers the magnetic sensor 401 so that the influence of disturbance of an external magnetic field around the magnetic sensor 401 is reduced. Therefore, the manufacturing cost of the apparatus 503 is reduced.

The apparatus 503 is suitably used for detecting a rotation of a cam of camshaft in an engine of an automotive vehicle or a gear of a crankshaft in an engine of a vehicle.

Although the apparatus 503 includes the rotation body 411, the apparatus 503 can have another type of rotation body such as the rotation body 411*c*, of which N and S poles are disposed alternately on a circumferential periphery thereof. In this case, the sensor casing 512*a* is not required to work as a bias magnet. Therefore, the sensor casing 512*a* merely works as a magnetic shield. In this case, the apparatus 503 provides a wheel rotation sensor for ABS of the vehicle.

Such changes and modifications are to be understood as being within the scope of the present invention as defined by the appended claims.

What is claimed is:

1. A method for manufacturing a magnetic sensor apparatus that includes a semiconductor substrate field, wherein the magnetic impedance device is disposed on the substrate, the method comprising:
   forming a stress relaxation layer on the substrate;
   forming a magnetic impedance device for detecting a magnetic field on the stress relaxation layer; and
   forming an oxidation protection film on the magnetic impedance device, wherein
   the stress relaxation layer reduces a stress generated in the substrate in a case where the substrate and the magnetic impedance device are processed in a heat treatment, and
   the oxidation protection film is made of silicon oxides, silicon nitrides, or a composite film of silicon oxides and silicon nitrides.

2. The method according to claim 1, wherein the stress relaxation layer is made of poly-imide.

* * * * *